US009991318B2

(12) United States Patent
Kim et al.

(10) Patent No.: US 9,991,318 B2
(45) Date of Patent: Jun. 5, 2018

(54) ORGANIC LIGHT EMITTING DISPLAY DEVICE

(71) Applicant: Samsung Display Co., Ltd, Yongin-si, Gyeonggi-do (KR)

(72) Inventors: Mu-Gyeom Kim, Hwaseong-si (KR); Min-Soo Kim, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days. days.

(21) Appl. No.: 15/257,147

(22) Filed: Sep. 6, 2016

(65) Prior Publication Data

US 2017/0278898 A1  Sep. 28, 2017

(30) Foreign Application Priority Data

Mar. 24, 2016  (KR) .................. 10-2016-0035194

(51) Int. Cl.
*H01L 27/32* (2006.01)
*H01L 51/52* (2006.01)

(52) U.S. Cl.
CPC ........ *H01L 27/323* (2013.01); *H01L 27/3258* (2013.01); *H01L 27/3262* (2013.01); *H01L 27/3276* (2013.01); *H01L 51/5246* (2013.01); *H01L 51/5271* (2013.01)

(58) Field of Classification Search
CPC ............... H01L 27/323; H01L 27/3258; H01L 27/3262; H01L 27/3276; H01L 51/5246; H01L 51/5271
See application file for complete search history.

(56) References Cited

U.S. PATENT DOCUMENTS

| 2011/0273082 | A1 | 11/2011 | Kim | |
|---|---|---|---|---|
| 2012/0069444 | A1 | 3/2012 | Campbell et al. | |
| 2014/0055028 | A1* | 2/2014 | Yi | H05B 33/04 313/498 |
| 2016/0109998 | A1* | 4/2016 | Watanabe | G06F 3/0412 349/12 |
| 2016/0124557 | A1* | 5/2016 | Choi | G06F 3/0412 345/173 |
| 2017/0010734 | A1* | 1/2017 | Liu | G06F 3/044 |
| 2017/0078513 | A1* | 3/2017 | Chang | G06F 3/0488 |
| 2017/0123543 | A1* | 5/2017 | Choi | G06F 3/0412 |

* cited by examiner

*Primary Examiner* — Allan R Wilson
(74) *Attorney, Agent, or Firm* — Innovation Counsel, LLP

(57) ABSTRACT

An organic light emitting diode (OLED) display device includes a substrate, reflection structure, and a sub-pixel structure. The substrate includes a plurality of sub-pixel regions and a reflection region surrounding the sub-pixel regions. The reflection structure is disposed on the substrate in the reflection region and has a plurality of openings exposing the sub-pixel regions. The reflection structure includes first reflection patterns, second reflection patterns, and connection patterns. The first reflection patterns extend in a first direction parallel to an upper surface of the substrate, and are spaced apart from each other in a second direction perpendicular to the first direction. The second reflection patterns are spaced apart from each other in the first direction between two adjacent first reflection patterns. The connection patterns electrically connect two adjacent second reflection patterns in the second direction. The sub-pixel structure is disposed on the substrate in the sub-pixel region.

31 Claims, 21 Drawing Sheets

FIG. 21
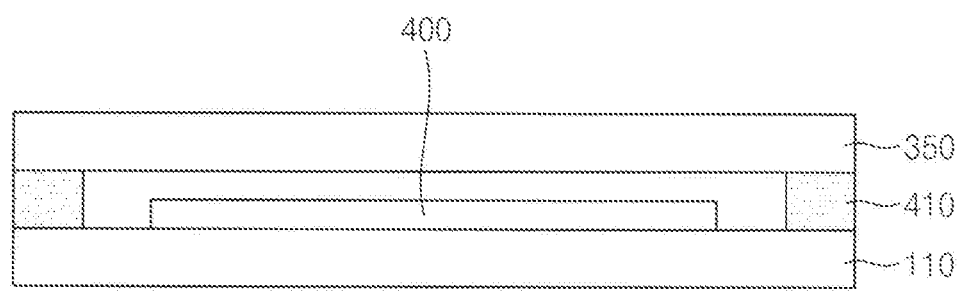
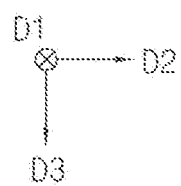

ORGANIC LIGHT EMITTING DISPLAY DEVICE

CROSS-REFERENCE TO RELATED APPLICATION(S)

This application claims priority under 35 USC § 119 to Korean Patent Applications No. 10-2016-0035194, filed on Mar. 24, 2016 in the Korean Intellectual Property Office (KIPO), the disclosure of which is incorporated herein in its entirety by reference.

BACKGROUND

1. Field

Example embodiments of the present disclosure relate generally to organic light emitting diode (OLED) display devices, more particularly, to OLED display devices including a reflection region.

2. Description of the Related Art

A flat panel display (FPD) device is widely used as a display device of an electronic device due to its lightweight and thinness compared to a cathode-ray tube (CRT) display device. Typical examples of the FPD device are a liquid crystal display (LCD) device and an organic light emitting diode (OLED) display device. Compared to the LCD device, the OLED device has several advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby emitting a light of a certain wavelength.

Recently, a mirror OLED device including a pixel region and a reflection region has been developed. The mirror OLED device is capable of reflecting an image of an object (or a target) that is located in front of the OLED device by the reflection region.

SUMMARY

Some example embodiments of the present disclosure provide an organic light emitting diode (OLED) display device capable of reflecting an image of an object that is located in front of the OLED device.

According to some aspect of example embodiments, an OLED device includes a substrate, a reflection structure, and a sub-pixel structure. The substrate includes a plurality of sub-pixel regions and a reflection region surrounding the plurality of sub-pixel regions. The reflection structure is disposed on the substrate in the reflection region and has a plurality of openings exposing the plurality of sub-pixel regions. The reflection structure includes first reflection patterns, second reflection patterns, and connection patterns. The first reflection patterns extend in a first direction that is parallel to an upper surface of the substrate, and is spaced apart from each other in a second direction that is perpendicular to the first direction. The second reflection patterns are spaced apart from each other in the first direction between two adjacent first reflection patterns among the first reflection patterns. The connection patterns electrically connect two adjacent second reflection patterns in the second direction among the second reflection patterns. The sub-pixel structure is disposed on the substrate in each of the plurality of sub-pixel regions.

In example embodiments, the reflection structure is disposed between the substrate and the sub-pixel structure.

In example embodiments, the first reflection patterns may be configured to receive a first touch sensing voltage from an external device, and the second reflection patterns may be configured to receive a second touch sensing voltage from the external device. The external device may detect a change of capacitance between the first reflection patterns and the second reflection patterns.

In example embodiments, each of the first reflection patterns may have a planar bar shape and may be regularly arranged in the second direction. Each of the second reflection patterns may have an island shape and may be regularly arranged in the first direction. The first reflection patterns and the second reflection patterns may be spaced apart from each other.

In example embodiments, each of the first and second reflection patterns may have a mesh structure including the plurality of openings.

In example embodiments, at least one groove may be formed in a border of the first reflection pattern and the second reflection pattern.

In example embodiments, the OLED device may further include a thin film encapsulation structure disposed on the sub-pixel structure. Each of the substrate and the thin film encapsulation structure may have a stack structure where at least one organic layer and at least one inorganic layer are alternately stacked, and the stack structure may be flexible. The reflection structure may be in contact with the at least one inorganic layer of the substrate, and the sub-pixel structure may be in contact with the at least one inorganic layer of the thin film encapsulation structure.

In example embodiments, the OLED device may further include an encapsulation substrate and a sealant. The encapsulation substrate may be disposed on the sub-pixel structure. The sealant may be interposed between the substrate and the encapsulation substrate, and may be disposed in outer regions of the substrate and the encapsulation substrate. Each of the substrate and the encapsulation substrate may include rigid materials, and the sealant may include a frit. The substrate and the encapsulation substrate may be combined by the sealant.

In example embodiments, the sub-pixel structure may include a lower electrode, a light emitting layer, and an upper electrode. The lower electrode may be disposed on the substrate and may transmit a light. The light emitting layer may be disposed on the lower electrode. The upper electrode may be disposed on the light emitting layer, and may reflect a light that is emitted from the light emitting layer. A reflectivity of the upper electrode may be greater than a reflectivity of the lower electrode, and the upper electrode may be disposed on the substrate in the sub-pixel region and the reflection region.

In example embodiments, the reflection structure may reflect an image of an object that is located in front of a first surface of the OLED device, and the upper electrode may reflect an image of an object that is located in front of a second surface of the OLED device. The second surface may be opposite to the first surface, and the OLED device may display a displaying image in the first surface through the plurality of openings.

In example embodiments, the OLED device may further include a semiconductor and a buffer layer. The semiconductor element may be disposed on the substrate in the reflection region. The buffer layer may be disposed on the substrate between the reflection structure and the semiconductor element. The semiconductor element includes an active layer disposed on the buffer layer in the reflection region, a gate electrode disposed on the active layer, and source and drain electrodes disposed on the gate electrode.

In example embodiments, the connection patterns and the gate electrode may be simultaneously formed using the same material.

In example embodiments, the OLED device may further include a dielectric mirror structure disposed between the substrate and the reflection structure.

In example embodiments, the dielectric mirror structure may include one or more first dielectric layers and one or more second dielectric layers. The one or more first dielectric layers may have a first refractive index, and the one or more second dielectric layers may be disposed on the one or more first dielectric layers. The one or more second dielectric layers may have a second refractive index that is different from the first refractive index. The one or more first dielectric layers and the one or more second dielectric layers may be alternately stacked.

According to some aspect of example embodiments, an OLED device includes a substrate, reflection structure, and a sub-pixel structure. The substrate includes a plurality of sub-pixel regions and a reflection region surrounding the plurality of sub-pixel regions. The sub-pixel structure may be disposed on the substrate in each of the plurality of sub-pixel regions. The reflection structure is disposed on the substrate in the reflection region and has a plurality of openings, and the plurality of sub-pixel regions may be exposed through the plurality of openings. The reflection structure includes first reflection patterns and second reflection patterns. The first reflection patterns may be arranged in a first direction, and the second reflection patterns may be arranged in the second direction that is perpendicular to the first direction.

In example embodiments, the reflection structure may be disposed between the substrate and the sub-pixel structure In example embodiments, the first reflection patterns may be configured to receive a first touch sensing voltage from an external device, and the second reflection patterns may be configured to receive a second touch sensing voltage from the external device. The external device may detect a change of capacitance between the first reflection patterns and the second reflection patterns.

In example embodiments, each of the first and second reflection patterns may have a planar bar shape and may be regularly arranged to each other. Each of the first and second reflection patterns may have a mesh structure including the plurality of openings.

In example embodiments, the first reflection patterns and the second reflection patterns may be crossed to each other in a cross-over regions, and a first group of the plurality of openings of the first reflection patterns and a second group of the plurality of openings of the second reflection patterns that are located in the cross-over region may be overlapped to each other.

In example embodiments, the OLED device may further include a thin film encapsulation structure disposed on the sub-pixel structure. Each of the substrate and the thin film encapsulation structure may have a stack structure where at least one organic layer and at least one inorganic layer are alternately stacked, and the stack structure may be flexible. The reflection structure may be in contact with the at least one inorganic layer of the substrate, and the sub-pixel structure may be in contact with the at least one inorganic layer of the thin film encapsulation structure.

In example embodiments, the OLED device may further include a semiconductor element and a buffer layer. The semiconductor element may be disposed on the substrate in the reflection region. The buffer layer may be disposed on the substrate between the first reflection pattern and the semiconductor element. The semiconductor element may include an active layer disposed on the buffer layer in the reflection region, a gate electrode disposed on the active layer, and source and drain electrodes disposed on the gate electrode. The second reflection patterns and the gate electrode may be simultaneously formed using the same material.

In example embodiments, the OLED device may further include an auxiliary wiring. The auxiliary wiring may be disposed on the second reflection pattern, and may be electrically connected to the second reflection patterns. The auxiliary wiring and the source and drain electrodes may be simultaneously formed using the same materials.

In example embodiments, the OLED device may further include a dielectric mirror structure disposed between the substrate and the reflection structure. The dielectric mirror structure may include one or more first dielectric layers and one or more second dielectric layers. The one or more first dielectric layers may have a first refractive index. The one or more second dielectric layers may be disposed on the one or more first dielectric layers and may have a second refractive index that is different from the first refractive index. The one or more first dielectric layers and the one or more second dielectric layers may be alternately stacked.

According to example embodiments, an OLED device includes a substrate, a sub-pixel structure, and a sensing structure. The substrate may include a plurality of sub-pixel regions and a reflection region surrounding the plurality of sub-pixel regions. The sub-pixel structure may be disposed on the substrate in each of the plurality of sub-pixel regions. The sensing structure may be disposed on the substrate in the reflection region and may have a plurality of openings. The plurality of sub-pixel regions may be exposed through the plurality of openings. The sensing structure may include first sensing patterns and second sensing patterns insulated from the first sensing patterns. The sensing structure may be disposed between the substrate and the sub-pixel structure.

In example embodiments, the sensing structure may further include connection patterns electrically connecting two adjacent second sensing patterns in a second direction among the second sensing patterns. The first sensing patterns may extend in a first direction that is perpendicular to the second direction and may be spaced apart from each other in the second direction. The second sensing patterns may be spaced apart from each other in the first direction and the second direction.

In example embodiments, the first sensing patterns may be arranged in a first direction, and the second sensing patterns may be arranged in a second direction that is perpendicular to the first direction.

In example embodiments, each of the first sensing patterns and the second sensing patterns may reflect light entering through the substrate.

In example embodiments, the first sensing patterns may be applied with a first voltage and the second sensing patterns may be applied with a second voltage. A change of capacitance between the first sensing patterns and the second sensing patterns may be detected to determine a position of touch.

In example embodiments, the first voltage may be a sensing input signal and the second voltage may be a sensing output signal.

In example embodiments, the change of capacitance between the first sensing patterns and the second sensing patterns may measure a pressure of touch.

In example embodiments, the OLED device may further include a circuit that is configured to generate the first voltage and the second voltage An OLED device according to example embodiments includes the reflection structure having the first reflection patterns and the second reflection patterns that may serve as touch sensor electrodes. The reflection structure may reflect an image of an object that is located in front of the OLED device. Accordingly, the OLED device may serve as a mirror OLED device of a bottom emission structure having a relatively thin thickness because the OLED device does not include a touch screen panel. In addition, as the OLED device includes the flexible substrate and the encapsulation substrate, the OLED device may have a curved shape. Further, an image of an object that is located in front of the back of the OLED device may be reflected from the upper electrode.

BRIEF DESCRIPTION OF THE DRAWINGS

Example embodiments can be understood in more detail from the following description taken in conjunction with the accompanying drawings, in which:

FIG. 21 is a cross-sectional view describing a sealant included in the OLED device of FIG. 20.

DETAILED DESCRIPTION OF THE EMBODIMENTS

Hereinafter, embodiments of the present disclosure will be explained in detail with reference to the accompanying drawings.

Figure 1:
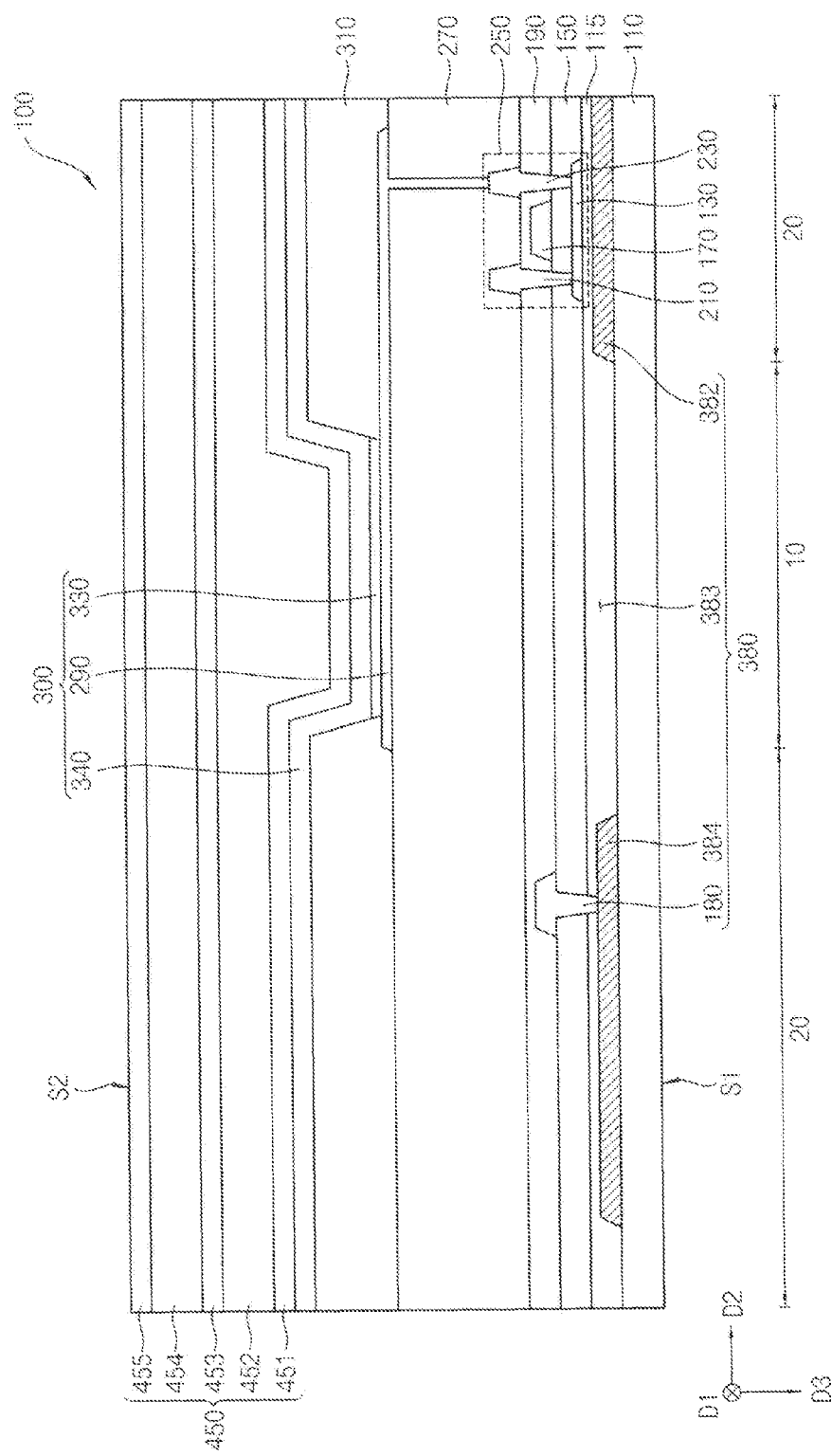
FIG. 1 is a cross-sectional view illustrating an organic light emitting diode (OLED) display device in accordance with example embodiments.
Figure 2:
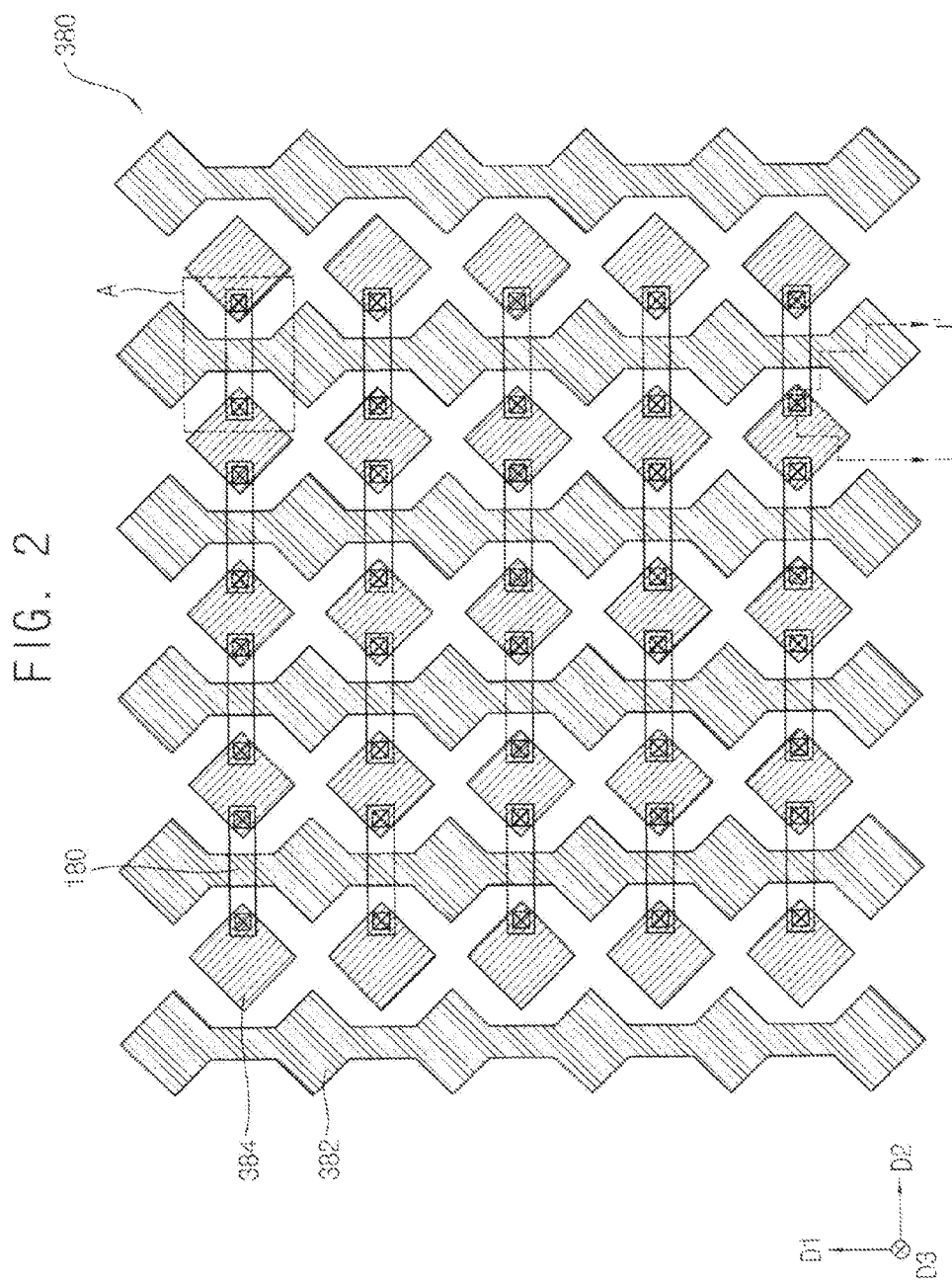
FIG. 2 is a planar view describing a reflection structure included in the OLED device of FIG. 1.
Figure 3:
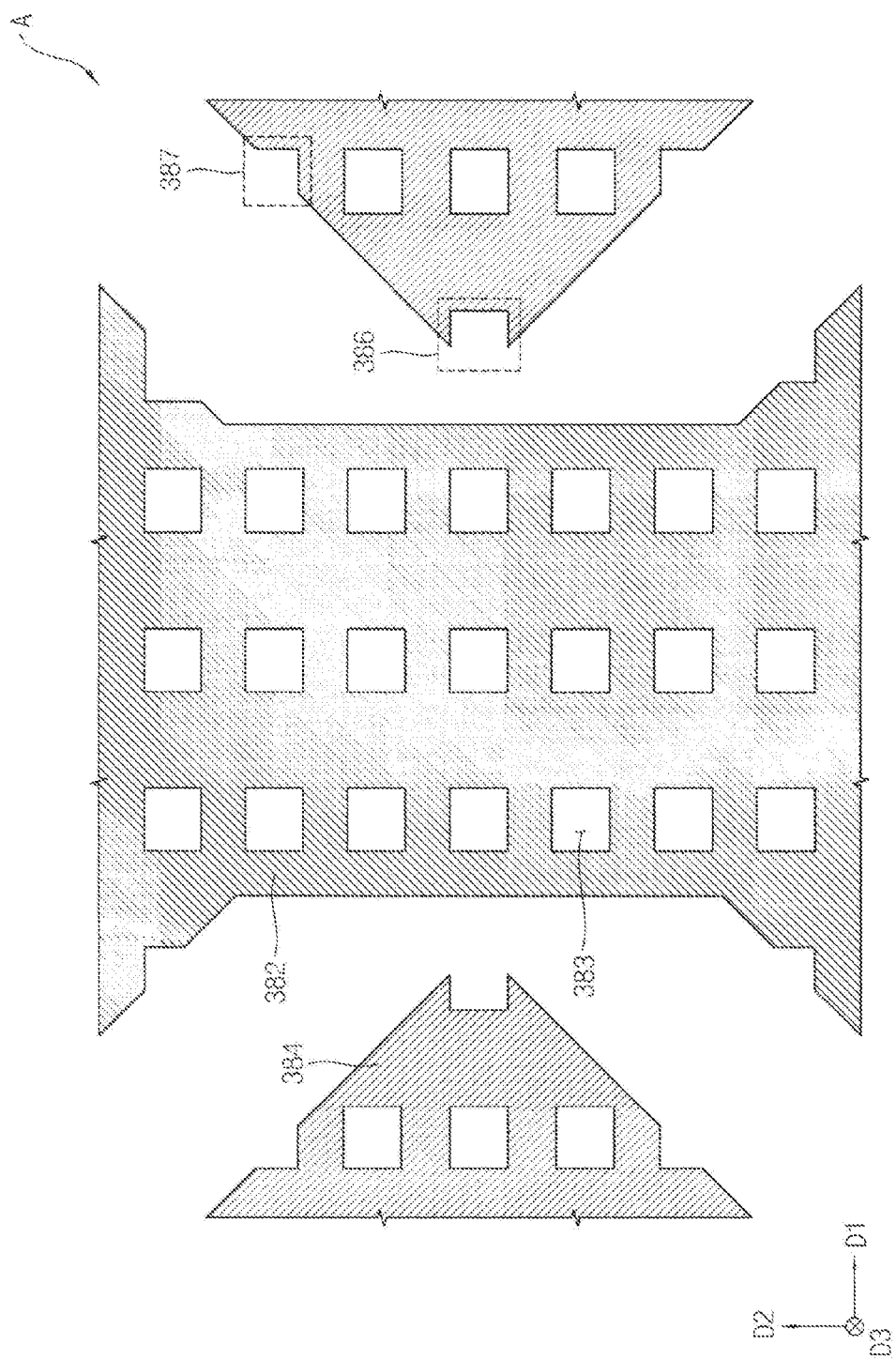
FIG. 3 is an enlarged planar view corresponding to region 'A' of FIG. 2.
Figure 4:
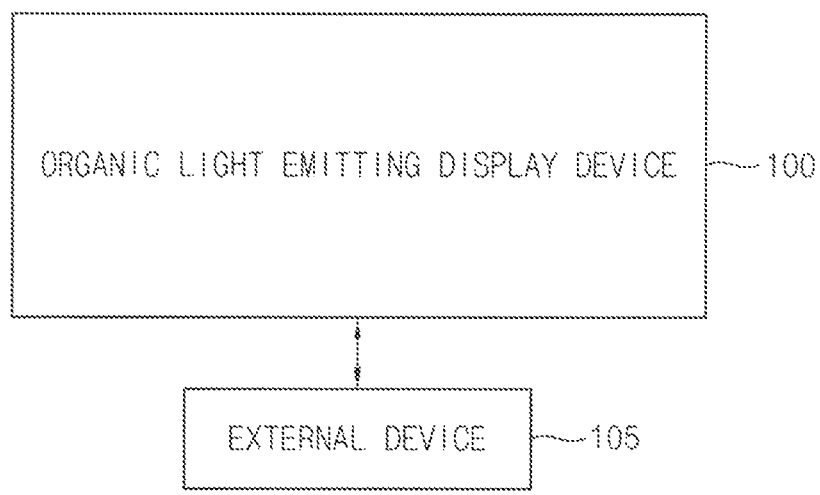
FIG. 4 is a block diagram for describing an external device electrically connected to a reflection structure included in the OLED device of FIG. 1

FIG. 1 is a cross-sectional view illustrating an organic light emitting diode (OLED) display device in accordance with example embodiments, and FIG. 2 is a planar view describing a reflection structure included in the OLED device of FIG. 1. FIG. 3 is an enlarged planar view corresponding to region 'A' of FIG. 2, and FIG. 4 is a block diagram for describing an external device electrically connected to a reflection structure included in the OLED device of FIG. 1. FIG. 1 may correspond to a cross-sectional view taken along line I-I' of FIG. 2.

Referring to FIGS. 1, 2, 3, and 4, an OLED device 100 may include a substrate 110, a reflection structure 380, a buffer layer 115, a semiconductor element 250, a planarization layer 270, a sub-pixel structure 300, a pixel defining layer 310, and a thin film encapsulation (TFE) structure 450. Here, the semiconductor element 250 may include an active layer 130, a gate insulation layer 150, a gate electrode 170, an insulating interlayer 190, a source electrode 210, and a drain electrode 230. The sub-pixel structure 300 may include a lower electrode 290, a light emitting layer 330, and an upper electrode 340. In addition, the reflection structure 380 may include a plurality of first reflection patterns 382, a plurality of second reflection patterns 384, and a plurality of connection patterns 180. As illustrated in FIGS. 2 and 3, each of the first reflection patterns 382 may extend in a first direction D1 that is parallel to an upper surface of the substrate 110, and may be spaced apart from each other in a second direction D2 that is substantially perpendicular to the first direction D1. Each of the second reflection patterns 384 may be spaced apart from each other in the first direction D1 between adjacent two the first reflection patterns 382 among a plurality of the first reflection patterns 382. The connection pattern 180 may electrically connect adjacent two second reflection patterns 384 in the second direction D2 among a plurality of the second reflection patterns 384. In addition, touch sensing voltages may be applied to the reflection structure 380, and the OLED device 100 may sense a user's touch on the surface of the OLED device 100 using a changed by detecting a change of capacitance.

The OLED device 100 may include a sub-pixel region 10 and a reflection region 20. The sub-pixel region 10 may be located between the sub-pixel regions 10. The sub-pixel structure 300 may be disposed in the sub-pixel region 10, and a displaying image may be displayed in a third direction D3 (i.e., a direction that is perpendicular to the first direction D1 and the second direction D2) from the TFE structure 450 into the substrate 110. In addition, the reflection structure 380 and the semiconductor element 250 may be disposed in the reflection region 20, and an image of an object that is located in front (i.e., a first (lower) surface of the substrate 110) of the OLED device 100 may be displayed in the third direction D3 on the reflection structure 380. As the OLED device 100 includes the reflection structure 380 capable of reflecting the image of the object that is located in front of the OLED device 100 and serving as a touch sensing electrode, the OLED device 100 may serve as a mirror OLED device of a bottom emission structure capable of sensing a touch input of the user.

Referring again to FIG. 1, the substrate 110 may be formed of a transparent material. In example embodiments, the substrate 110 may be formed of a flexible transparent material such as a flexible transparent resin substrate (e.g., a polyimide substrate). The polyimide substrate may include at least one polyimide layer and at least one barrier layer. Since the polyimide substrate is relatively thin and flexible, the polyimide substrate may be disposed on a rigid glass substrate to help support the formation of an upper structure (e.g., the reflection structure 380, the semiconductor element 250, and the sub-pixel structure 300). The substrate 110 may have a structure in which one or more polyimide layers and one or more barrier layers are alternately stacked on the rigid glass substrate. In a manufacturing the OLED device 100, after the buffer layer 115 is provided on the barrier layer of the polyimide substrate, the upper structure may be disposed on the buffer layer 115. After the upper structure is formed on the buffer layer 115, the rigid glass substrate under which the polyimide substrate is disposed may be removed. It may be difficult to directly form the upper structure on the polyimide substrate because the polyimide substrate is relatively thin and flexible. Accordingly, the upper structure is formed on the polyimide substrate and the rigid glass substrate, and then the polyimide substrate may serve as the substrate 110 of the OLED device 100 after the removal of the rigid glass substrate. As the OLED device 100 includes the sub-pixel region 10 and the reflection region 20, the substrate 110 may also include the sub-pixel region 10 and the reflection region 20.

The polyimide layer may include a random copolymer or block copolymer. The polyimide layer may have a high transparency, a low coefficient of thermal expansion, and a high glass transition temperature. Since the polyimide layer includes an imide radical, the polyimide layer may have an excellent heat resistance, chemical resistance, wear resistance, and electrical characteristics.

The barrier layer may include an organic material or an inorganic material. Examples of the organic material include, but are not limited to, a photoresist, a polyacryl-based resin, a polyimide-based resin, a polyamide-based resin, a siloxane-based resin, an acryl-based resin, and an epoxy-based resin. Examples of the inorganic materials include, but are not limited to, a silicon compound, and a metal oxide. For example, the barrier layer may include, but are not limited to, silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), and titanium oxide (TiOx). In example embodiments, the barrier layer may include essentially an inorganic material. The barrier layer may block water or moisture from permeating into the sub-pixel structure 300 via the polyimide layer. That is, the barrier layer and the TFE structure 450 may protect the sub-pixel structure 300. Alternatively, the substrate 110 may include a quartz substrate, a synthetic quartz substrate, a calcium fluoride substrate, a fluoride-doped quartz substrate, a soda lime glass substrate, a non-alkali substrate, or the like.

Referring to FIGS. 1, 2, 3, and 4, the reflection structure 380 may be disposed on the substrate 110 in the reflection region 20. The reflection structure 380 may include a plurality of first reflection patterns 382 and a plurality of second reflection patterns 384. The first reflection patterns 382 and the second reflection patterns 384 may be disposed on the barrier layer of the substrate 10, and the barrier layer may be an inorganic layer. Each of the first reflection patterns 382 may extend in the first direction D1. In addition, each of the first reflection patterns 382 may be spaced apart from each other in the second direction D2, and may be regularly arranged. Further, each of the first reflection patterns 382 may have a substantially planar shape of a bar including a plurality of protrusion portions. The second reflection patterns 384 may be regularly arranged in the first direction D1 between adjacent first reflection patterns 382 among the plurality of first reflection patterns 382, and may have an island shape. For example, the island shape of the second reflection pattern 384 may be a planar square, and may be disposed between the protrusion portions of adjacent first reflection patterns 382. The connection pattern 180 may be in contact with and electrically connected to adjacent two second reflection patterns 384 in the second direction D2 among the plurality of second reflection patterns 384. The first reflection patterns 382 and the second reflection patterns 384 may be spaced apart from each other, and may be located at the same level on the substrate 10. While the connection pattern 180 may be located at different levels with the first and second reflection patterns 382 and 384. For example, the connection pattern 180 may be disposed on the first and second reflection patterns 382 and 384. As described above, since the OLED device 100 includes the reflection structure 380, an image of an object that is located in front of the first surface S1 of the OLED device 100 may be reflected in the third direction D3.

In example embodiments, as illustrated in FIGS. 2 and 3, each of the first reflection patterns 382 and the second reflection patterns 384 may have a mesh structure including a plurality of openings 383. The sub-pixel region 10 may correspond to each of the openings 383, and the sub-pixel structure 300 may be disposed in a region corresponding to each of the openings 383. That is, a first group of sub-pixel regions 10 may be located in the openings 383 included in the first reflection pattern 382, and a second group of sub-pixel regions 10 may be located in the openings 383 included in the second reflection pattern 384. As described above, as the OLED device 100 includes the openings 383 of the reflection structure 380, a light emitted from the sub-pixel structure 300 may be emitted via the openings 383 in the third direction D3. In example embodiments, as illustrated in FIG. 3, grooves 386 and 387 may be formed in a border or an edge of the first reflection pattern 382 and the second reflection pattern 384 where at least a lateral portion of the opening 383 is opened. The grooves 386 and 387 may be formed to expose the corresponding sub-pixel regions 10.

In example embodiments, as illustrated FIG. 4, the OLED device 100 may electrically connect the first and second reflection patterns 382 and 384 and an external device 105 through a touch sensor wiring (not shown), and may provide first and second touch sensing voltages generated from the external device 105 to the first and second reflection patterns 382 and 384, respectively. The external device 105 may detect a change of capacitance between the first reflection pattern 382 and the second reflection pattern 384. The external device 105 may provide the first touch sensing voltage that is a sensing input signal to the first reflection pattern 382 and receive the second touch sensing voltage that is a sensing output signal through the second reflection pattern 384. Here, the first touch sensing voltage may have a voltage level that is periodically changed (or a periodically variable voltage level), and the second touch sensing voltage may have a direct current voltage level. For example, when the user of the OLED device 100 contacts the first surface S1 (e.g., a contact of a user's finger, a portion of a user's body, a touch pen.), a capacitance between the first reflection pattern 382 and the second reflection pattern 384 that are corresponding to (or adjacent to) the contact surface may be changed. In other word, a change of capacitance may be generated between a portion of the body that is contacted to the first surface S1 and the first and second reflection patterns 382 and 384, and the external device 105 may receive the sensing output signal that is changed by the changed capacitance through the touch sensor wiring. Thus, the external device 105 may detect the changed sensing output signal. That is, the external device 105 and the OLED device 100 may sense a contact position of the user's touch using the first and second touch sensing voltages. Each of the first reflection pattern 382 and the second reflection pattern 384 may include one or more of a metal, a metal alloy, metal nitride, conductive metal oxide, and a transparent conductive material. For example, each of the first reflection patterns 382 and the second reflection patterns 384 may be formed of gold (Au), silver (Ag), aluminum (Al), an alloy of aluminum, aluminum nitride (AlNx), silver (Ag), an alloy of silver, tungsten (W), tungsten nitride (WNx), copper (Cu), an alloy of copper, nickel (Ni), palladium (Pd), magnesium (Mg), Calcium (Ca), Lithium (Li), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), or indium zinc oxide (IZO). These may be used alone or in a suitable combination thereof. Alternatively, each of the first reflection patterns 382 and the second reflection patterns 384 may have a multi-layered structure.

Accordingly, although the first and second reflection patterns 382 and 384 having a respective thickness are disposed, the OLED device 100 may display the displaying image in the third direction D3 via the openings 383. The thicknesses of the first and second reflection patterns 382 and 384 are determined to be thick enough to reflect light such that the OLED device 100 may reflect an image of an object that is located in front of the first surface S1 of the OLED device 100 in the third direction D3. In addition, the OLED device 100 may detect a contact position of the user through the reflection structure 380 and the external device 105.

In FIG. 4, the external device 105 is disposed outside of the OLED device 100, but the present disclosure is not limited thereto. In some example embodiments, the external device 105 may be disposed inside of the OLED device 100 or integrated into the OLED device 100.

In addition, the OLED device 100 may employ a mutual-capacitance sensing method, but the present disclosure is not limited thereto. In some example embodiments, the OLED device 100 may use a self-capacitance sensing method.

Referring again to FIG. 1, the buffer layer 115 may be disposed on the substrate 110 and the reflection structure 380. The buffer layer 115 may be disposed on the entire substrate 110 covering the first reflection pattern 382 and the second reflection pattern 384 in the reflection region 20 on the substrate 110. For example, the buffer layer 115 may cover the first reflection pattern 382 and the second reflection pattern 384 to provide a substantially even surface without a step around the first reflection pattern 382 and the second reflection pattern 384. Alternatively, the buffer layer 115 may cover the first reflection pattern 382 and the second reflection pattern 384, and may be disposed with a substantially uniform thickness along a profile of the first reflection pattern 382 and the second reflection pattern 384. The buffer layer 115 may prevent diffusion of metal atoms and/or impurities into the substrate 110 into the semiconductor element 250. Additionally, the buffer layer 115 may control a rate of a heat transfer in a crystallization process for forming the active layer 130, thereby obtaining a substantially uniform active layer. Furthermore, the buffer layer 115 may improve a surface flatness of the substrate 110 when a surface of the substrate 110 is relatively uneven. According to a type of the substrate 110, at least two buffer layers 115 may be provided on the substrate 110, or the buffer layer 115 may not be disposed. In some example embodiments, the buffer layer 115 may include one or more of SiOx, SiNx, and SiOxNy.

The active layer 130 may be disposed on the buffer layer 115 in the reflection region 20. For example, the active layer 130 may include one or more of an oxide semiconductor, an inorganic semiconductor (e.g., amorphous silicon and polysilicon), and an organic semiconductor.

The gate insulation layer 150 may be disposed on the buffer layer 115 and the active layer 130. The gate insulation layer 150 may cover the active layer 130 in the reflection region 20 on the buffer layer 115, and may be disposed on the entire substrate 110. For example, the gate insulation layer 150 may cover the active layer 130 to provide a substantially even surface without a step around the active layer 130. Alternatively, the gate insulation layer 150 may cover the active layer 130, and may be disposed with a substantially uniform thickness along a profile of the active layer 130. The gate insulation layer 150 may include one or more of a silicon compound and a metal oxide.

The gate electrode 170 and the connection pattern 180 may be disposed on the gate insulation layer 150. The gate electrode 170 may be disposed on a portion of the gate insulation layer 150 in the reflection region 20 to overlap the active layer 130 in a planar view. The gate electrode 170 may include one or more of a metal, a metal alloy, metal nitride, conductive metal oxide, and a transparent conductive material. These may be used alone or in a suitable combination thereof. Alternatively, the gate electrode 170 may have a multi-layered structure.

The connection pattern 180 may be disposed on a portion of the gate insulation layer 150 in the reflection region 20 to overlap the second reflection patterns 384 in a planar view. The connection pattern 180 may be in contact with the second reflection patterns 384 via a contact hole formed by partially removing the gate insulation layer 150 and the buffer layer 115. As illustrated in FIG. 2, the connection pattern 180 may electrically connect adjacent two the second reflection patterns 384 among a plurality of the second reflection patterns 384. The connection pattern 180 may include one or more of a metal, a metal alloy, metal nitride, conductive metal oxide, and a transparent conductive material. These may be used alone or in a suitable combination thereof. Alternatively, the connection pattern 180 may have a multi-layered structure. In example embodiments, the connection pattern 180 and the gate electrode 170 may be simultaneously formed using the same material.

The insulating interlayer 190 may be disposed on the gate insulation layer 150, the gate electrode 170, and the connection pattern 180. The insulating interlayer 190 may cover the gate electrode 170 and the connection pattern 180 in the reflection region 20, and may be disposed on the entire substrate 110. For example, the insulating interlayer 190 may cover the gate electrode 170 and the connection pattern 180 to provide a substantially even surface without a step around the gate electrode 170 and the connection pattern 180. Alternatively, the insulating interlayer 190 may cover the gate electrode 170 and the connection pattern 180, and may be disposed with a substantially uniform thickness along a profile of the gate electrode 170 and the connection pattern 180. The insulating interlayer 190 may include one or more of a silicon compound and a metal oxide.

The source electrode 210 and the drain electrode 230 may be disposed on the insulating interlayer 190 in the reflection region 20. The source electrode 210 may be in contact with a first side of the active layer 130 via a first contact hole formed by removing a portion of the gate insulation layer 150 and the insulating interlayer 190. The drain electrode 230 may be in contact with a second side of the active layer 130 via a second contact hole formed by removing a portion of the gate insulation layer 150 and the insulating interlayer 190. Each of the source and drain electrodes 210 and 230 may include one or more of a metal, a metal alloy, metal nitride, conductive metal oxide, and a transparent conductive material. These may be used alone or in a suitable combination thereof. Alternatively, each of the source and drain electrodes 210 and 230 may have a multi-layered structure. Accordingly, the semiconductor element 250 including the active layer 130, the gate insulation layer 150, the gate electrode 170, the insulating interlayer 190, the source electrode 210, and the drain electrode 230 may be disposed.

In example embodiments, the semiconductor element 250 of the OLED device 100 has a top gate structure, but the present disclosure is not limited thereto. In some example embodiments, the semiconductor element 250 may have a bottom gate structure.

The planarization layer 270 may be disposed on the insulating interlayer 190 and the source and drain electrodes 210 and 230. For example, the planarization layer 270 may be disposed with a relatively large thickness to cover the insulating interlayer 190 and the source and drain electrodes 210 and 230. In this case, the planarization layer 270 may have a substantially even upper surface, and a planarization process may be further performed on the planarization layer 270 to implement the even upper surface of the planarization layer 270. The planarization layer 270 may include one or more of an organic material and inorganic material.

The lower electrode 290 may be disposed on the planarization layer 270 in the sub-pixel region 10 and a portion of the reflection region 20. For example, a thickness of the lower electrode 290 may be less than that of the upper electrode 340 such that a light emitted from the light emitting layer 330 is transmitted in the third direction D3. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may be substantially transparent. For example, the lower electrode 290 may include one or more of a metal, a metal alloy, metal nitride, conductive metal oxide, and a transparent conductive material. In some example embodiments, the lower electrode 290 may have a multi-layered structure.

The pixel defining layer 310 may be disposed on a portion of the lower electrode 290 and the planarization layer 270. For example, the pixel defining layer 310 may cover both lateral portions of the lower electrode 290 such that a portion of an upper surface of the lower electrode 290 is exposed. The pixel defining layer 310 may include an organic material or an inorganic material.

The light emitting layer 330 may be disposed on the lower electrode 290 at the portion exposed by the pixel defining layer 310. The light emitting layer 330 may have a multi-layered structure including one or more of an emission layer (EL), a hole injection layer (HIL), a hole transfer layer (HTL), an electron transfer layer (ETL), and an electron injection layer (EIL). The HIL, the HTL, the EL, the ETL, and the EIL may be sequentially disposed between the lower electrode 290 and the upper electrode 340. The EL of the light emitting layer 330 may be formed using at least one of light emitting materials capable of generating different colors of light (e.g., a red color of light, a blue color of light, and a green color of light). Alternatively, the EL of the light emitting layer 330 may generally generate a white color of light by stacking a plurality of light emitting materials capable of generating different colors of light such as a red color of light, a green color of light, and a blue color of light. In this case, a color filter may be disposed under the light emitting layer 330 to overlap the light emitting layer 330 on the insulating interlayer 190. The color filter may include at least one selected from a red color filter, a green color filter, and a blue color filter. Alternatively, the color filter may include a yellow color filter, a cyan color filter, and a magenta color filter. The color filter may include a photosensitive resin or a color photoresist.

The upper electrode 340 may be disposed on the pixel defining layer 310 and the light emitting layer 330 in the sub-pixel region 10 and the reflection region 20. The upper electrode 340 may be entirely disposed on the pixel defining layer 310 and the light emitting layer 330. The OLED device 100 may display a displaying image toward the third direction D3 in the sub-pixel region 10 (e.g., a bottom emission structure). Thus, a reflectivity of the upper electrode 340 may be greater than that of the lower electrode 290 such that a light emitted from the light emitting layer 330 is reflected from the upper electrode 340 in the third direction D3. The reflectivity of the upper electrode 340 and the lower electrode 290 may be varied by changing the material properties and/or the thickness of the upper electrode 340 and the lower electrode 290. In example embodiments, the upper electrode 340 may reflect an image of an object that is located in front of a second surface S2 of the OLED device 100, and the second surface S2 of the OLED device 100 may be opposite to the first surface S1 of the OLED device 100. For example, when the TFE structure 450 is transparent, an image of an object that is located in a direction −D3 that is opposite to the third direction D3 may be displayed on the upper electrode 340. That is, the OLED device 100 may reflect the image of the object in both directions (e.g., D3 and −D3) or on the both surfaces (e.g., the first and second surfaces S1 and S2). In some example embodiments, when the upper electrode 340 transmits a portion of a light and reflects a remaining portion of the light, the OLED device 100 may display the displaying image on the both surfaces. In this case, the OLED device 100 may reflect the image of the object in the both surfaces and may display the displaying image on the both surfaces. The upper electrode 340 may include one or more of a metal, a metal alloy, metal nitride, and conductive metal oxide. For example, the upper electrode 340 may be formed of Au, Ag, Al, Pt, Ni, Ti, Pd, Mg, Ca, Li, Cr, Ta, W, Cu, Mo, Sc, Nd, Iridium (Ir), an alloy of aluminum, AlNx, an alloy of silver, WNx, an alloy of copper, CrNx, an alloy of molybdenum, TiNx, TaNx, SRO, etc. These may be used alone or in a suitable combination thereof. Alternatively, the upper electrode 340 may have a multi-layered structure.

The TFE structure 450 may be disposed on the upper electrode 340. For example, the first encapsulation layer 451 may be disposed on the sub-pixel structure 300. The TFE structure 450 may include at least one first encapsulation layer and at least one second encapsulation layer. For example, the second encapsulation layer 452 may be disposed on the first encapsulation layer 451. The first encapsulation layers 451, 453, and 455 and the second encapsulation layers 452 and 454 may be alternately and repeatedly arranged. The first encapsulation layer 451 may cover the upper electrode 340, and may be disposed with a substantially uniform thickness along a profile of the upper electrode 340. The first encapsulation layer 451 may prevent the sub-pixel structure 300 form being deteriorated by the permeation of moisture, water, oxygen, etc. In addition, the first encapsulation layer 451 may protect the sub-pixel structure 300 from an external impact. The first encapsulation layer 451 may include an inorganic material.

The second encapsulation layer 452 may be disposed on the first encapsulation layer 451. The second encapsulation layer 452 may improve a surface flatness of the OLED device 100, and may protect the sub-pixel structure 300 disposed in the sub-pixel region 10. The second encapsulation layer 452 may include an organic material.

The first encapsulation layer 453 may be disposed on the second encapsulation layer 452. The first encapsulation layer 453 may cover the second encapsulation layer 452, and may be disposed with a substantially uniform thickness along a profile of the second encapsulation layer 452. The first encapsulation layer 453 together with the first encapsulation layer 451 and the second encapsulation layer 452 may prevent the sub-pixel structure 300 form being deteriorated by the permeation of moisture, water, oxygen, etc. In addition, the first encapsulation layer 453 together with the first encapsulation layer 451 and the second encapsulation layer 452 may protect the pixel structure from an external impact. The first encapsulation layer 453 may include an inorganic material.

The second encapsulation layer 454 may be disposed on the first encapsulation layer 453. The second encapsulation layer 454 may perform functions substantially the same as or similar to those of the second encapsulation layer 452, and the second encapsulation layer 454 may include a material substantially the same as or similar to that of the second encapsulation layer 452. The first encapsulation layer 455 may be disposed on the second encapsulation layer 454. The first encapsulation layer 455 may perform functions substantially the same as or similar to those of the first encapsulation layers 451 and 453, and the first encapsulation layer 455 may include a material substantially the same as or similar to that of the first encapsulation layers 451 and 453. As described above, the OLED device 100 includes the flexible substrate 110 and the TFE structure 450, and may have a curved shape. Since the reflection structure 380 having a thickness that is thick enough to reflect light is disposed in the reflection region 20, the reflection region 20 may not be readily bent. However, the openings 383 of the reflection structure 380 disposed in the sub-pixel region 10 allows the sub-pixel region 10 to be bent. Accordingly, the OLED device 100 may have a substantially curved shape.

In some example embodiments, the TFE structure 450 may have a triple-layered structure having the first encapsulation layer 451, the second encapsulation layer 452, and the first encapsulation layer 453. In other example embodiments, the TFE structure 450 may have a septuple-layered structure including the first encapsulation layer 451, the second encapsulation layer 452, the first encapsulation layer 453, the second encapsulation layer 454, the first encapsulation layer 455, an extra first encapsulation layer, and an extra second encapsulation layer. Alternatively, when the substrate 110 is formed as a rigid substrate, the TFE structure 450 may include one or more of a quartz substrate, a synthetic quartz substrate, a calcium fluoride substrate, a fluoride-doped quartz substrate, a sodalime glass substrate, and a non-alkali substrate.

The OLED device 100 in accordance with example embodiments includes the reflection structure 380 and the upper electrode 340. The displaying image may be displayed via the openings 383, and the image of an object that is located in front of the first surface S1 of the OLED device 100 may be reflected from the reflection structure 380. In some example embodiments, the first reflection patterns 382, the second reflection patterns 384, and the connection pattern 180 included in the reflection structure 380 may serve as touch sensing electrodes to detect a contact position of a user's touch on the OLED device 100. Further, the image of the object that is located in front of the second surface S2 of the OLED device 100 may be reflected from the upper electrode 340. Accordingly, the OLED device 100 may serve as a mirror OLED device of a bottom emission structure having a relatively thin thickness because the OLED device 100 does not include a touch screen panel. In addition, the OLED device 100 including the flexible substrate 110 and the TFE structure 450 may be made to have a curved shape.

FIGS. 5, 6, 7, 8, 9, and 10 are cross-sectional views illustrating a method of manufacturing an OLED device in accordance with example embodiments.

Figure 5:
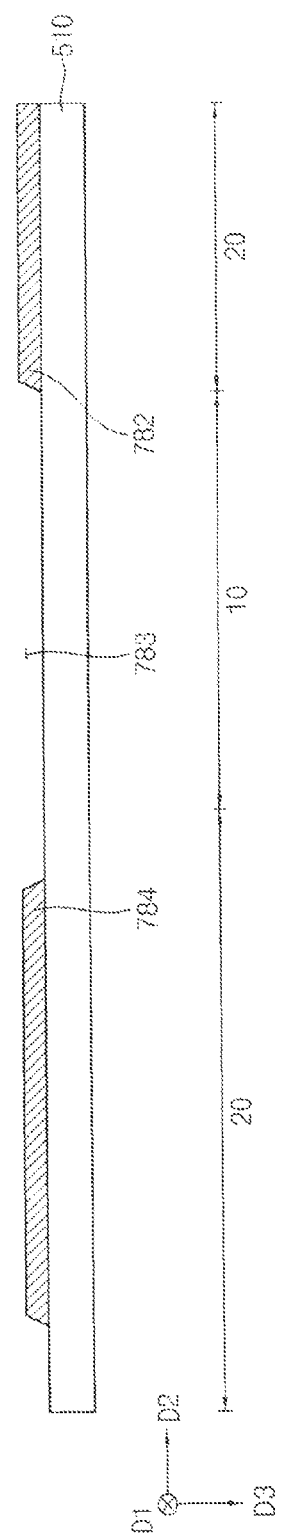
FIGS. 5, 6, 7, 8, 9, and 10 are cross-sectional views illustrating a method of manufacturing an OLED device in accordance with example embodiments.

Referring to FIG. 5, a substrate 510 including a sub-pixel region 10 and a reflection region 20 may be provided. The substrate 510 may be formed of a transparent material. The substrate 510 may be formed using a flexible transparent material such as a flexible transparent resin substrate (e.g., a polyimide substrate). In this case, the polyimide substrate may include at least one polyimide layer and at least one barrier layer.

The polyimide layer may be formed using a random copolymer or a block copolymer. The polyimide layer may have a high transparency, a low coefficient of thermal expansion, and a high glass transition temperature. Since the polyimide layer includes an imide radical, the polyimide layer may have an excellent heat resistance, chemical resistance, wear resistance, and electrical characteristics.

The barrier layer may be formed using an organic material or an inorganic material. Examples of the organic materials may include, but are not limited to, a photoresist, a polyacryl-based resin, a polyimide-based resin, a polyamide-based resin, a siloxane-based resin, an acryl-based resin, and an epoxy-based resin. An example of the inorganic materials may include, but are not limited to, silicon compound, metal oxide. For example, the buffer layer 115 may include SiOx, SiNx, SiOxNy, SiOxCy, SiCxNy, AlOx, AlNx, TaOx, HfOx, ZrOx, TiOx, etc. In example embodiments, the barrier layer may include essentially an inorganic material. The barrier layer may block water or moisture from permeating via the polyimide layer. Alternatively, the substrate 510 may be formed of a quartz substrate, a synthetic quartz substrate, a calcium fluoride substrate, a fluoride-doped quartz substrate, a soda lime glass substrate, or a non-alkali substrate.

A first reflection pattern 782 and a second reflection pattern 784 may be formed on the substrate 510 in the reflection region 20. Each of the first reflection patterns 782 may extend in the first direction D1. In addition, each of the first reflection patterns 782 may be spaced apart from each other in the second direction D2, and may be regularly arranged. Further, each of the first reflection patterns 782 may have a substantially planar shape of a bar including a plurality of protrusion portions. The second reflection patterns 784 may be regularly arranged in the first direction D1 between adjacent first reflection patterns 782 among the plurality of first reflection patterns 782, and may have an island shape. The first reflection patterns 782 and the second reflection patterns 784 may be spaced apart from each other, and may be located at the same level. The first reflection pattern 782 and the second reflection pattern 784 may reflect an image of an object that is located in front of a first surface S1 (e.g., a lower surface of the substrate 510) of an OLED device.

Each the first reflection pattern 782 and the second reflection pattern 784 may include a plurality of openings 783, similar to the plurality of openings 383 of FIG. 3. Here, the sub-pixel region 10 may correspond to the opening 783. For example, the sub-pixel structures may be formed in the openings 783, respectively. That is, a first group of sub-pixel regions 10 may be located in the openings 783 included in the first reflection pattern 782, and a second group of sub-pixel regions 10 may be located in the openings 783 included in the second reflection pattern 784. In example embodiments, grooves may be formed in a border or an edge) of the first reflection pattern 782 and the second reflection pattern 784 where at least of a lateral portion of the opening 783 is opened. The grooves may be formed to expose the corresponding sub-pixel regions 10.

In example embodiments, the OLED device may electrically connect the first and second reflection patterns 782 and 784 and an external device (e.g., the external device 105 of FIG. 4) through a touch sensor wiring (not shown), and may provide first and second touch sensing voltages generated from the external device to the first and second reflection patterns 782 and 784, respectively. In addition, the external device may detect a change of capacitance between the first reflection pattern 782 and the second reflection pattern 784. For example, the external device may provide the first touch sensing voltage that is a sensing input signal to the first reflection pattern 782 and receive the second touch sensing voltage that is a sensing output signal through the second reflection pattern 784. Here, the first touch sensing voltage may have a voltage level that is periodically changed, and the second touch sensing voltage may have a direct current voltage level.

Each of the first reflection pattern 782 and the second reflection pattern 784 may be formed using one or more of a metal, a metal alloy, metal nitride, conductive metal oxide, and a transparent conductive material. For example, each of the first reflection pattern 382 and the second reflection pattern 384 may be formed of Au, Ag, Al, an alloy of aluminum, AlNx, Ag, an alloy of silver, W, WNx, Cu, an alloy of copper, Ni, Pd, Mg, Ca, Li, Cr, CrNx, Mo, an alloy of molybdenum, Ti, TiNx, Pt, Ta, TaNx, Nd, Sc, SRO, ZnOx, SnOx, InOx, GaOx, ITO, or IZO. These may be used alone or in a suitable combination thereof. Alternatively, each of the first reflection pattern 782 and the second reflection pattern 784 may have a multi-layered structure.

Figure 6:
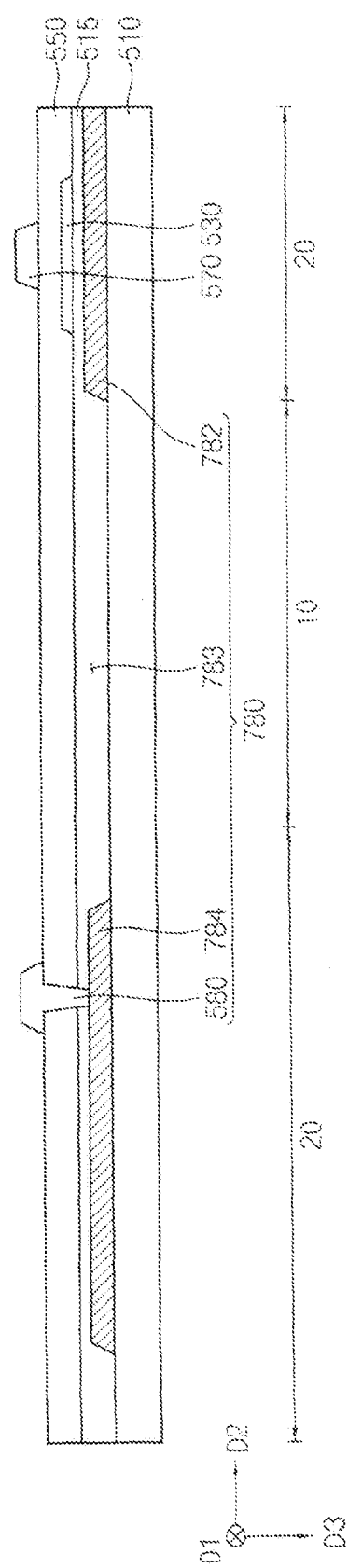

Referring to FIG. 6, a buffer layer 515 may be formed on the substrate 510, the first reflection pattern 782, and the second reflection pattern 784. The buffer layer 515 may be disposed on the substrate 510 covering the first reflection pattern 782 and the second reflection pattern 784 in the reflection region 20 on the substrate 510. For example, the buffer layer 515 may cover the first reflection pattern 782 and the second reflection pattern 784 to provide a substantially even surface without a step around the first reflection pattern 782 and the second reflection pattern 784. Alternatively, the buffer layer 515 may cover the first reflection pattern 782 and the second reflection pattern 784, and may be formed with a substantially uniform thickness along a profile of the first reflection pattern 782 and the second reflection pattern 784. The buffer layer 515 may prevent diffusion of metal atoms and/or impurities into the substrate 510. Additionally, the buffer layer 515 may control a rate of a heat transfer in a crystallization process for forming an active layer, thereby obtaining a substantially uniform active layer. Furthermore, the buffer layer 515 may improve a surface flatness of the substrate 510 when a surface of the substrate 510 is relatively uneven. According to a type of the substrate 510, at least two buffer layers 515 may be provided on the substrate 510, or the buffer layer 515 may not be disposed. In some example embodiments, the buffer layer 515 may be formed of SiOx, SiNx, or SiOxNy.

An active layer 530 may be disposed on the buffer layer 515 in the reflection region 20. For example, the active layer 530 may be formed of an oxide semiconductor, an inorganic semiconductor, or an organic semiconductor.

A gate insulation layer 550 may be formed on the buffer layer 515 and the active layer 530. The gate insulation layer 550 may cover the active layer 530 in the reflection region 20 on the buffer layer 515, and may be formed on the entire substrate 510. For example, the gate insulation layer 550 may cover the active layer 530 to provide a substantially even surface without a step around the active layer 530. Alternatively, the gate insulation layer 550 may cover the active layer 530, and may be formed with a substantially uniform thickness along a profile of the active layer 530. The gate insulation layer 550 may be formed of a silicon compound or a metal oxide.

A gate electrode 570 and a connection pattern 580 may be formed on the gate insulation layer 550. For example, after a preliminary electrode is formed on the gate insulation layer 550 having an opening (or a contact hole) that exposes a portion of the second reflection pattern 784, the gate electrode 570 and the conductive pattern 580 may be formed by partially removing the preliminary electrode. That is, the conductive pattern 580 and the gate electrode 570 may be simultaneously formed using the same material.

The gate electrode 570 may be formed on a portion of the gate insulation layer 550 in the reflection region 20 to overlap the active layer 530 in a planar view. The connection pattern 580 may be formed on a portion of the gate insulation layer 550 in the reflection region 20 to overlap the second reflection pattern 784 in a planar view. The connection pattern 580 may electrically connect adjacent two second reflection patterns 784 among a plurality of the second reflection patterns 784. Each of the gate electrode 570 and the connection pattern 580 may be formed using one or more of a metal, a metal alloy, metal nitride, conductive metal oxide, and a transparent conductive material. These may be used alone or in a suitable combination thereof. Alternatively, each of the gate electrode 570 and the connection pattern 580 may have a multi-layered structure. Accordingly, a reflection structure 780 including the first reflection pattern 782, the second reflection pattern 784, and the connection pattern 580 may be formed.

Figure 7:
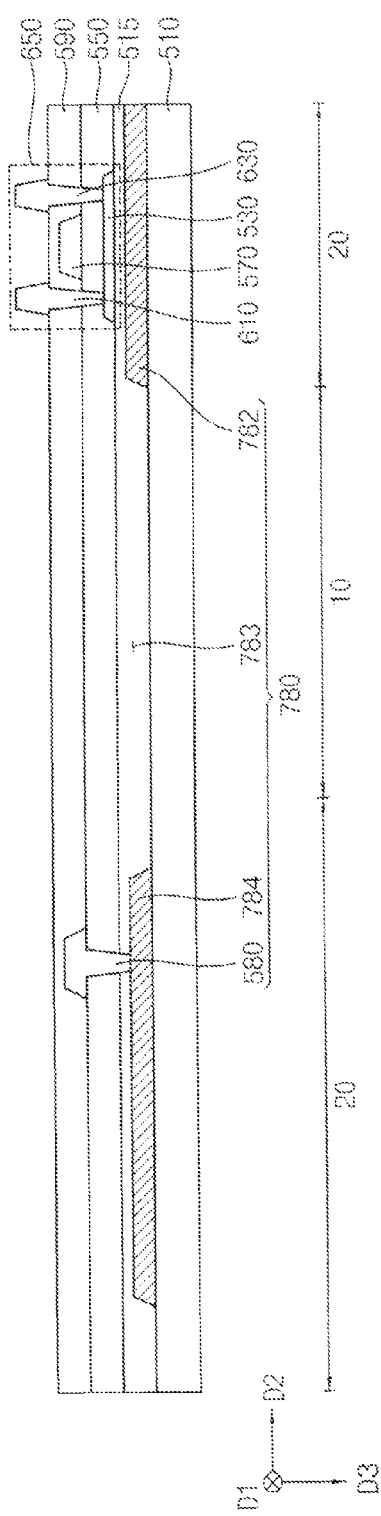

Referring to FIG. 7, an insulating interlayer 590 may be formed on the gate insulation layer 550, the gate electrode 570, and the connection pattern 580. The insulating interlayer 590 may cover the gate electrode 570 and the connection pattern 580 in the reflection region 20, and may be formed on the entire substrate 510. For example, the insulating interlayer 590 may cover the gate electrode 570 and the connection pattern 580 to provide a substantially even surface without a step around the gate electrode 570 and the connection pattern 580. Alternatively, the insulating interlayer 590 may cover the gate electrode 570 and the connection pattern 580, and may be formed with a substantially uniform thickness along a profile of the gate electrode 570 and the connection pattern 580. The insulating interlayer 590 may be formed of a silicon compound or a metal oxide.

A source electrode 610 and a drain electrode 630 may be formed on the insulating interlayer 590 in the reflection region 20. The source electrode 610 may be in contact with a first side of the active layer 530 via a first contact hole formed by removing a portion of the gate insulation layer 550 and the insulating interlayer 590. The drain electrode 630 may be in contact with a second side of the active layer 530 via a second contact hole formed by removing a portion of the gate insulation layer 550 and the insulating interlayer 590. Each of the source and drain electrodes 610 and 630 may be formed using one or more of a metal, a metal alloy, metal nitride, conductive metal oxide, and a transparent conductive material. These may be used alone or in a suitable combination thereof. Alternatively, each of the source and drain electrodes 610 and 630 may have a multi-layered structure. Accordingly, a semiconductor element 650 including the active layer 530, the gate insulation layer 550, the gate electrode 570, the insulating interlayer 590, the source electrode 610, and the drain electrode 630 may be formed.

Figure 8:
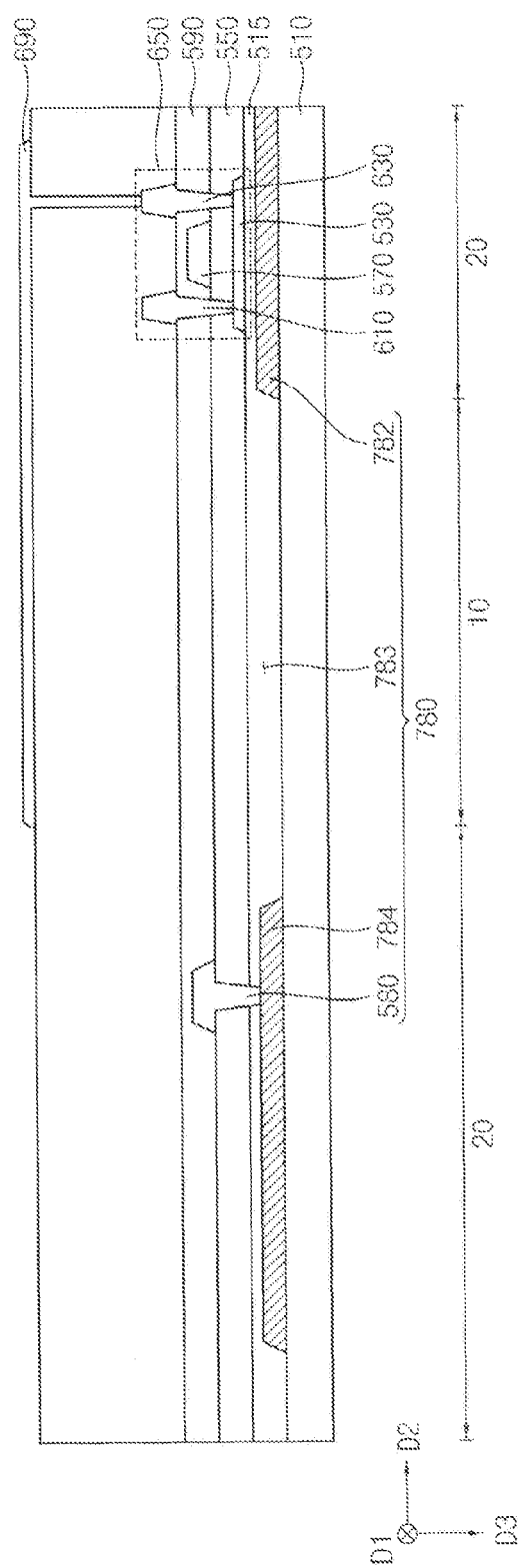

Referring to FIG. 8, a planarization layer 670 may be formed on the insulating interlayer 590 and the source and drain electrodes 610 and 630. For example, the planarization layer 670 may be disposed with a relatively large thickness to cover the insulating interlayer 590 and the source and drain electrodes 610 and 630. In this case, the planarization layer 670 may have a substantially even upper surface, and a planarization process may be further performed on the planarization layer 670 to implement the even upper surface of the planarization layer 670. The planarization layer 670 may be formed using an organic material or an inorganic material.

A lower electrode 690 may be formed on the planarization layer 670 in the sub-pixel region 10 and a portion of the reflection region 20. For example, a reflectivity of the lower electrode 690 may be less than that of an upper electrode such that a light emitted from a light emitting layer is transmitted in a third direction D3 that is perpendicular to the first and second directions D1 and D2. The lower electrode 690 may be in contact with the drain electrode 630 via a contact hole formed by removing a portion of the planarization layer 670. In addition, the lower electrode 690 may be electrically connected to the semiconductor element 650. The lower electrode 690 may be substantially transparent. For example, the lower electrode 690 may be formed of a metal, a metal alloy, metal nitride, conductive metal oxide, or a transparent conductive material. In some example embodiments, the lower electrode 690 may have a multi-layered structure.

Figure 9:
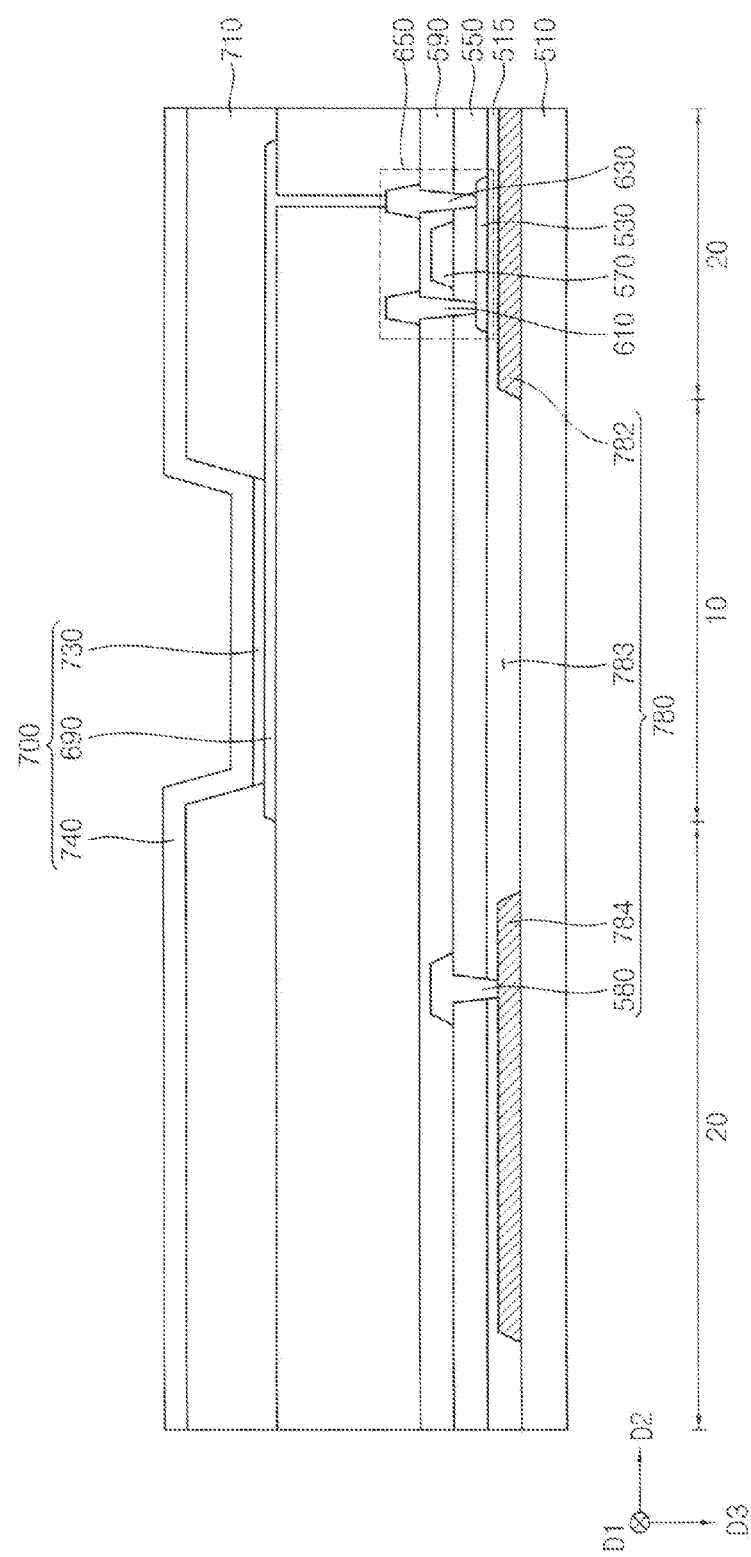

Referring to FIG. 9, a pixel defining layer 710 may be formed on a portion of the lower electrode 690 and the planarization layer 670. For example, the pixel defining layer 710 may cover both lateral portions of the lower electrode 690 such that a portion of an upper surface of the lower electrode 690 is exposed. The pixel defining layer 710 may be formed using an organic material or an inorganic material.

The light emitting layer 730 may be formed on the lower electrode 690 at the portion exposed by the pixel defining layer 710. The light emitting layer 730 may have a multi-layered structure including one or more of an EL, an HIL, an HTL, an ETL, and an EIL. The HIL, the HTL, the EL, the ETL, and the EIL may be sequentially formed between the lower electrode 690 and an upper electrode 740. The EL of the light emitting layer 730 may be formed using at least one of light emitting materials capable of generating different colors of light (e.g., a red color of light, a blue color of light, and a green color of light). Alternatively, the EL of the light emitting layer 730 may generally generate a white color of light by stacking a plurality of light emitting materials capable of generating different colors of light such as a red color of light, a green color of light, and a blue color of light. In this case, a color filter may be formed under the light emitting layer 730 to overlap the light emitting layer 730 on the insulating interlayer 590. The color filter may include at least one selected from a red color filter, a green color filter, and a blue color filter. Alternatively, the color filter may include a yellow color filter, a cyan color filter, and a magenta color filter. The color filter may be formed using a photosensitive resin or a color photoresist.

The upper electrode 740 may be formed on the pixel defining layer 710 and the light emitting layer 730 in the sub-pixel region 10 and the reflection region 20. The upper electrode 740 may be entirely formed on the pixel defining layer 710 and the light emitting layer 730. The OLED device may display a displaying image toward the third direction D3 in the sub-pixel region 10. Thus, a reflectivity of the upper electrode 740 may be greater than that of the lower electrode 690 such that a light emitted from the light emitting layer 730 is reflected from the upper electrode 740 in the third direction D3. In example embodiments, the upper electrode 740 may reflect an image of an object that is located in front of a second surface S2 of the OLED device, and the second surface S2 of the OLED device may be opposite to the first surface S1 of the OLED device. The upper electrode 740 may be formed of a metal, a metal alloy, metal nitride, or conductive metal oxide. These may be used alone or in a suitable combination thereof. Alternatively, the upper electrode 740 may have a multi-layered structure. Accordingly, a sub-pixel structure 700 including the lower electrode 690, the light emitting layer 730, and the upper electrode 740 may be formed.

Figure 10:
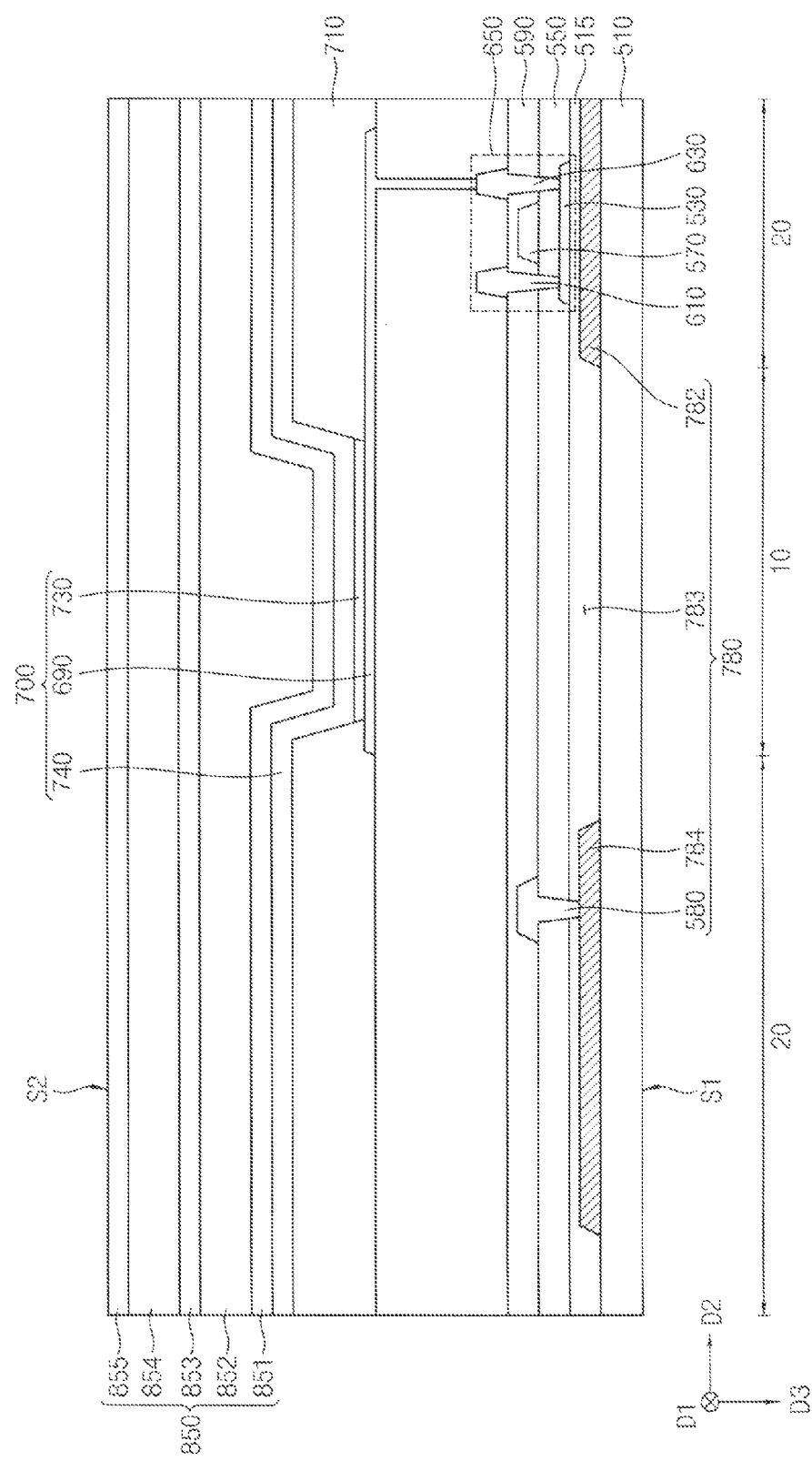

Referring to FIG. 10, a TFE structure 850 may be formed on the upper electrode 740. The TFE structure 850 may include at least one first encapsulation layer and at least one second encapsulation layer. For example, the second encapsulation layer 852 may be disposed on the first encapsulation layer 851. The first encapsulation layers 851, 853, and 855 and the second encapsulation layers 852 and 854 may be alternately and repeatedly arranged. The first encapsulation layer 851 may cover the upper electrode 740, and may be formed with a substantially uniform thickness along a profile of the upper electrode 740. The first encapsulation layer 851 may prevent the sub-pixel structure 700 form being deteriorated by the permeation of moisture, water, oxygen, etc. In addition, the first encapsulation layer 851 may protect the sub-pixel structure 700 from an external impact. The first encapsulation layer 851 may be formed of an inorganic material.

The second encapsulation layer 852 may be formed on the first encapsulation layer 851. The second encapsulation layer 852 may improve a surface flatness of the OLED device, and may protect the sub-pixel structure 700 formed in the sub-pixel region 10. The second encapsulation layer 852 may be formed of an organic material.

The first encapsulation layer 853 may be formed on the second encapsulation layer 852. The first encapsulation layer 853 may cover the second encapsulation layer 852, and may be formed with a substantially uniform thickness along a profile of the second encapsulation layer 852. The first encapsulation layer 853 together with the first encapsulation layer 851 and the second encapsulation layer 852 may prevent the sub-pixel structure 700 form being deteriorated by the permeation of moisture, water, oxygen, etc. In addition, the first encapsulation layer 853 together with the first encapsulation layer 851 and the second encapsulation layer 852 may protect the pixel structure from an external impact. The first encapsulation layer 853 may be formed using inorganic materials.

The second encapsulation layer 854 may be formed on the first encapsulation layer 853. The second encapsulation layer 854 may perform functions substantially the same as or similar to those of the second encapsulation layer 852, and the second encapsulation layer 854 may be formed using a material substantially the same as or similar to that of the second encapsulation layer 852. A first encapsulation layer 855 may be formed on the second encapsulation layer 854. The first encapsulation layer 855 may perform functions substantially the same as or similar to those of the first encapsulation layers 851 and 853, and the first encapsulation layer 855 may be formed using a material substantially the same as or similar to that of the first encapsulation layers 851 and 853. As described above, the OLED device includes the flexible substrate 510 and the TFE structure 850, and may have a curved shape.

In some example embodiments, the TFE structure 850 may have a triple-layered structure having the first encapsulation layer 851, the second encapsulation layer 852, and the first encapsulation layer 853. In other example embodiments, the TFE structure 850 may have a septuple-layered structure including the first encapsulation layer 851, the second encapsulation layer 852, the first encapsulation layer 853, the second encapsulation layer 854, the first encapsulation layer 855, an extra first encapsulation layer, and an extra second encapsulation layer. Alternatively, when the substrate 510 is formed as a rigid substrate, the TFE structure 850 may include one or more of a quartz substrate, a synthetic quartz substrate, a calcium fluoride substrate, a fluoride-doped quartz substrate, a sodalime glass substrate, and a non-alkali substrate. Accordingly, the OLED device 100 illustrated in FIG. 1 may be manufactured.

Figure 11:
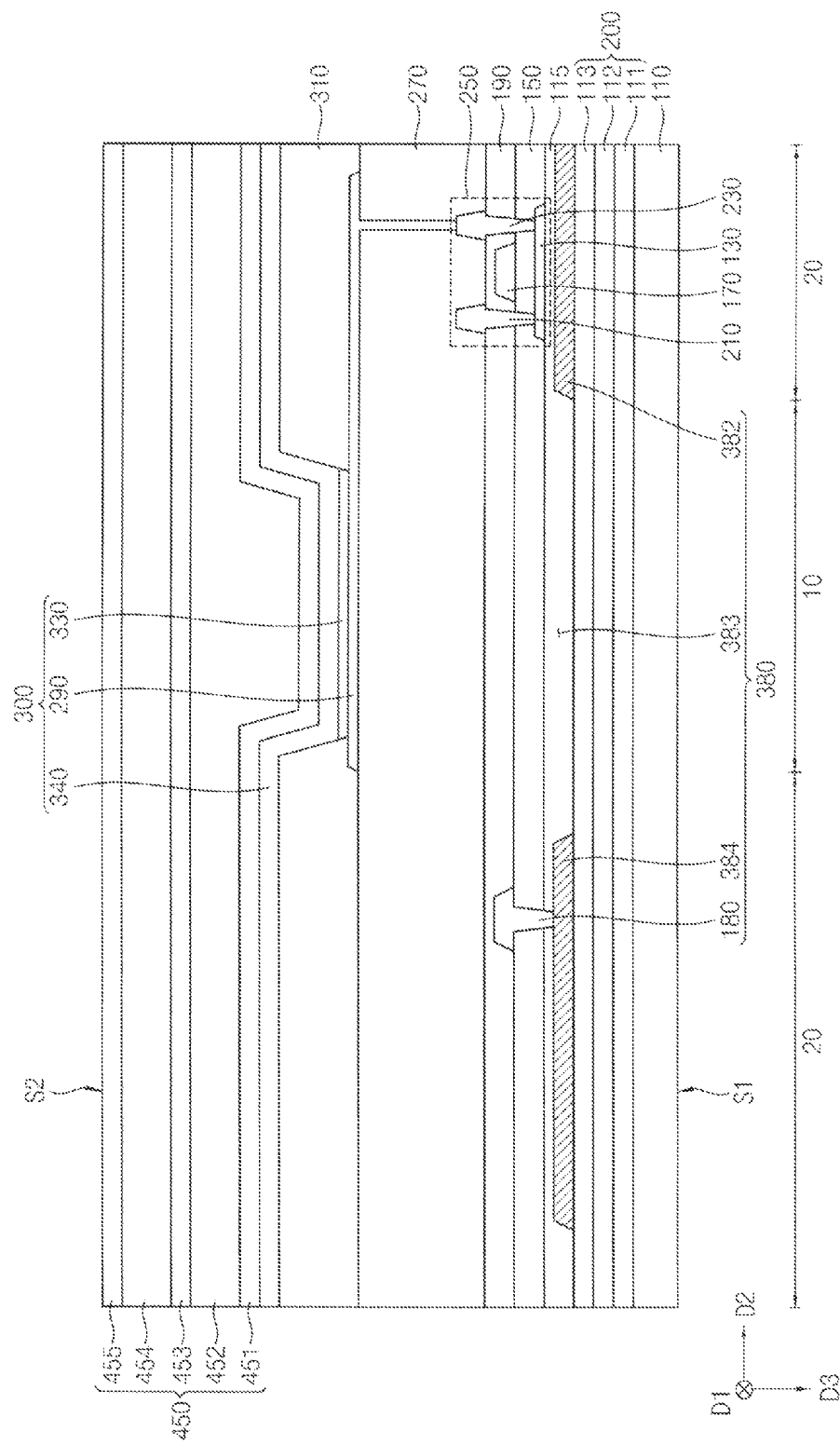
FIG. 11 is a cross-sectional view illustrating an OLED device in accordance with example embodiments.

FIG. 11 is a cross-sectional view illustrating an OLED device in accordance with example embodiments. An OLED device illustrated in FIG. 11 may have a configuration substantially the same as or similar to that of the OLED device 100 described with reference to FIGS. 1, 2, 3, and 4 except a dielectric mirror structure 200. In FIG. 11, detailed descriptions for elements that are substantially the same as or similar to elements described with reference to FIGS. 1, 2, 3, and 4 may not be repeated.

Referring to FIGS. 1, 2, 3, 4, and 11, an OLED device may include a substrate 110, a dielectric mirror structure 200, a reflection structure 380, a buffer layer 115, a semiconductor element 250, a planarization layer 270, a sub-pixel structure 300, a pixel defining layer 310, and a TFE structure 450. Here, the semiconductor element 250 may include an active layer 130, a gate insulation layer 150, a gate electrode 170, an insulating interlayer 190, a source electrode 210, and a drain electrode 230. The sub-pixel structure 300 may include a lower electrode 290, a light emitting layer 330, and an upper electrode 340. In addition, the reflection structure 380 may include a plurality of first reflection patterns 382, a plurality of second reflection patterns 384, and a plurality of connection patterns 180. Further, the dielectric mirror structure 200 may include a first dielectric layer 111, a second dielectric layer 112, and a third dielectric layer 113.

The first dielectric layer 111 may be disposed on the substrate 110 covering the entire substrate 110. In example embodiments, the first dielectric layer 111 may have a first refractive index. For example, the first dielectric layer 111 may have the first refractive index by controlling a weight ratio of materials included in the first dielectric layer 111, or by controlling a thickness of the first dielectric layer 111.

The first dielectric layer 111 may also serve as an additional barrier layer or an additional buffer layer. For example, the first dielectric layer 111 may include one or more of a silicon compound and metal oxide. For example, the first dielectric layer 111 may be formed of SiOx, SiNx, SiOxNy, SiOxCy, SiCxNy, AlOx, AlNx, TaOx, HfOx, ZrOx, or TiOx.

The second dielectric layer 112 may be disposed on the first dielectric layer 111 covering the entire first dielectric layer 111. In example embodiments, the second dielectric layer 112 may have a second refractive index that is different from the first refractive index. The second dielectric layer 112 may have the second refractive index by controlling a weight ratio of materials included in the second dielectric layer 112, or by controlling a thickness of the second dielectric layer 112. For example, the first refractive index may be a high refractive index, and the second refractive index may be a low refractive index. Alternatively, the first refractive index may be a low refractive index, and the second refractive index may be a high refractive index. The second dielectric layer 112 may also serve as an additional barrier layer and an additional buffer layer. The second dielectric layer 112 may include silicon compound, metal oxide, etc. For example, the second dielectric layer 112 may be formed of SiOx, SiNx, SiOxNy, SiOxCy, SiCxNy, AlOx, AlNx, TaOx, HfOx, ZrOx, or TiOx.

The third dielectric layer 113 may be disposed on the second dielectric layer 112 covering the entire second dielectric layer 112. In example embodiments, the third dielectric layer 113 may have the first refractive index. For example, the third dielectric layer 113 and the first dielectric layer 111 may be substantially the same. The third dielectric layer 113 may also serve as an additional barrier layer or an additional buffer layer. The third dielectric layer 113 may include a silicon compound or metal oxide. Accordingly, the dielectric mirror structure 200 including the first dielectric layer 111, the second dielectric layer 112, and the third dielectric layer 113 may be disposed. Alternatively, an additional dielectric layer may be disposed on the third dielectric layer 113. For example, the additional dielectric layer and the second dielectric layer 112 may have the same refractive index.

As described above, the dielectric mirror structure 200 may have a stack structure that the high refractive index layer and the low refractive index layer are alternately stacked. For example, an external light may pass through the substrate 110 in a direction −D3 (e.g., a direction from the substrate 110 into the TFE structure 450) that is opposite to the third direction D3. A portion of the external light passing through the substrate 110 may be reflected as a predetermined color by optical interference in boundary surfaces between the first, second, and third dielectric layers 111, 112, and 113. In particular, the dielectric mirror structure 200 may selectively reflect a light corresponding to a wavelength generating constructive or destructive optical interferences among the external light incident from the outside. In addition, a remaining portion of the external light passing through the substrate 110 may be reflected from the reflection patterns 382 and 384 toward the third direction D3 in the reflection region 20. Accordingly, an image of an object that is located in front of the OLED device may be reflected as a predetermined reflection color. For example, the first dielectric layer 111 is formed with a thickness of about 50 Angstroms by using TiOx, and the second dielectric layer 112 is formed with a thickness of about 300 Angstroms by using SiOx. In addition, the third dielectric layer 113 is formed with a thickness of about 350 Angstroms by using TiOx. In this case, the front of the OLED device may be shown as a substantially blue color. Alternatively, the first dielectric layer 111 is formed with a thickness of about 100 Angstroms by using TiOx, and the second dielectric layer 112 is formed with a thickness of about 300 Angstroms by using SiOx. In addition, the third dielectric layer 113 is formed with a thickness of about 1000 Angstroms by using TiOx. In this case, the front of the OLED device may be shown as a substantially brown color. In some example embodiments, the first dielectric layer 111 is formed with a thickness of about 200 Angstroms by using TiOx, and the second dielectric layer 112 is formed with a thickness of about 400 Angstroms by using SiOx. In addition, the third dielectric layer 113 is formed with a thickness of about 100 Angstroms by using TiOx. In this case, the front of the OLED device may be shown as a substantially silver color.

In example embodiments, when the semiconductor element 250 is not activated, the light emitting layer 330 may not emit a light (e.g., a turned-off state of the OLED device). In this case, an external light may pass through the substrate 110 in a direction −D3 that is opposite to the third direction D3. A portion of the external light passing through the substrate 110 may be reflected as a predetermined color by optical interference in boundary surfaces of the first, second, and third dielectric layers 111, 112, and 113. In particular, the dielectric mirror structure 200 may selectively reflect a light corresponding to a wavelength generating a constructive optical interference or a destructive optical interference among the external light incident from the outside. In addition, a remaining portion of the external light passing through the substrate 110 may be reflected from the upper electrode 740 toward the first direction D1 in the sub-pixel region 10. Accordingly, an image of an object that is located in front of the OLED device may be reflected as a predetermined reflection color.

Figure 12:
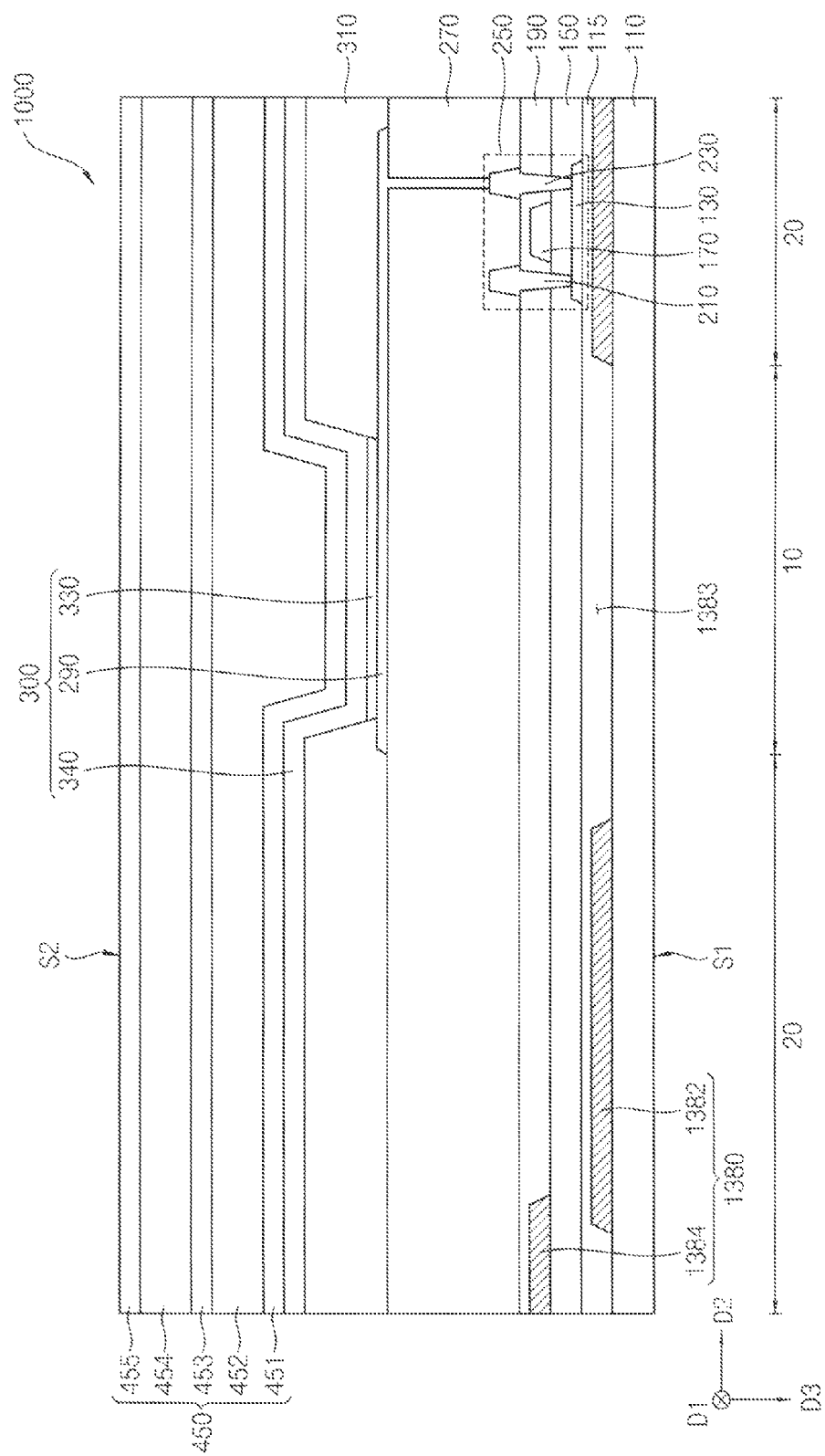
FIG. 12 is a cross-sectional view illustrating an OLED device in accordance with example embodiments.
Figure 13:
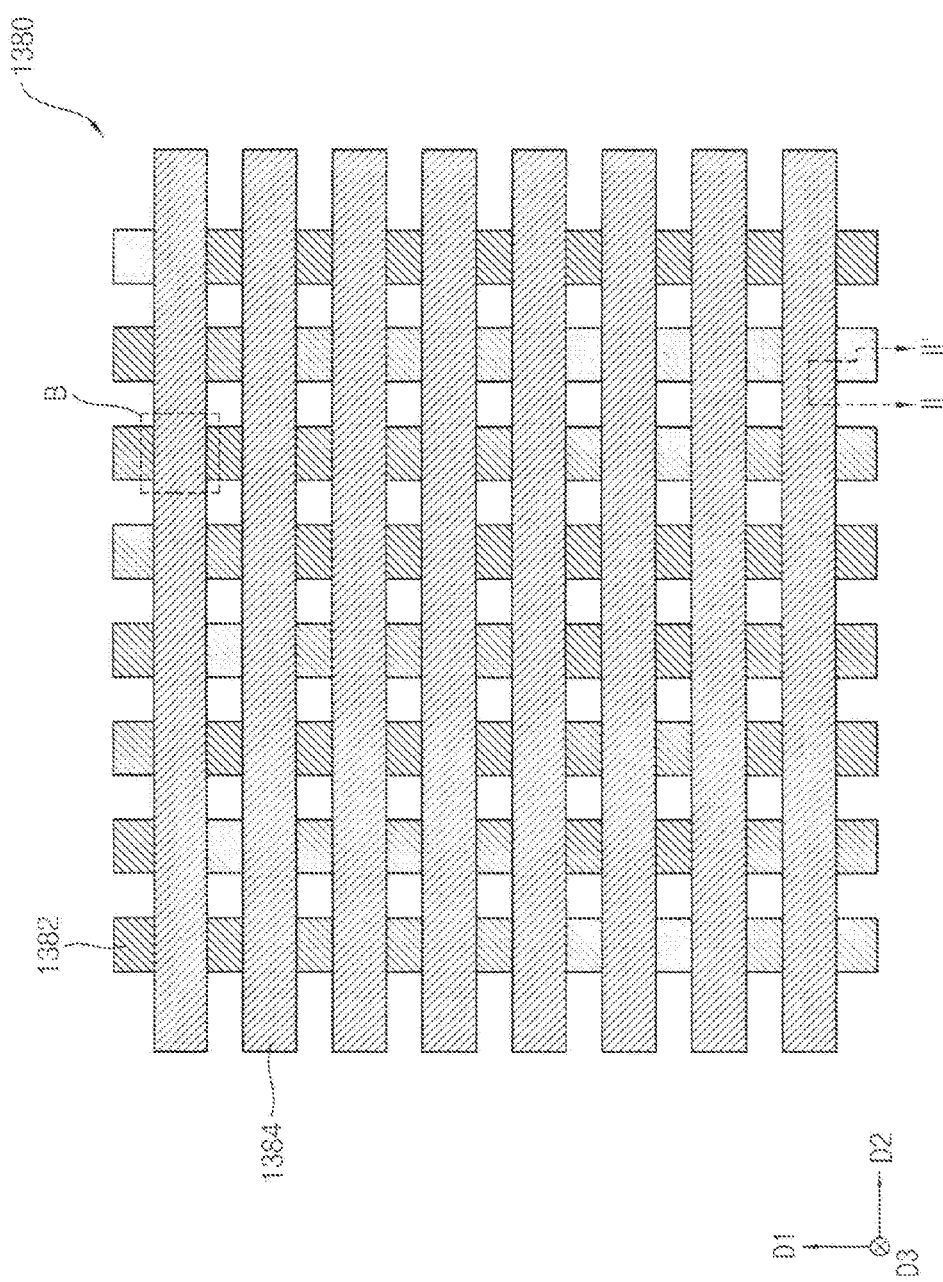
FIG. 13 is a planar view describing a reflection structure included in the OLED device of FIG. 12.
Figure 14:
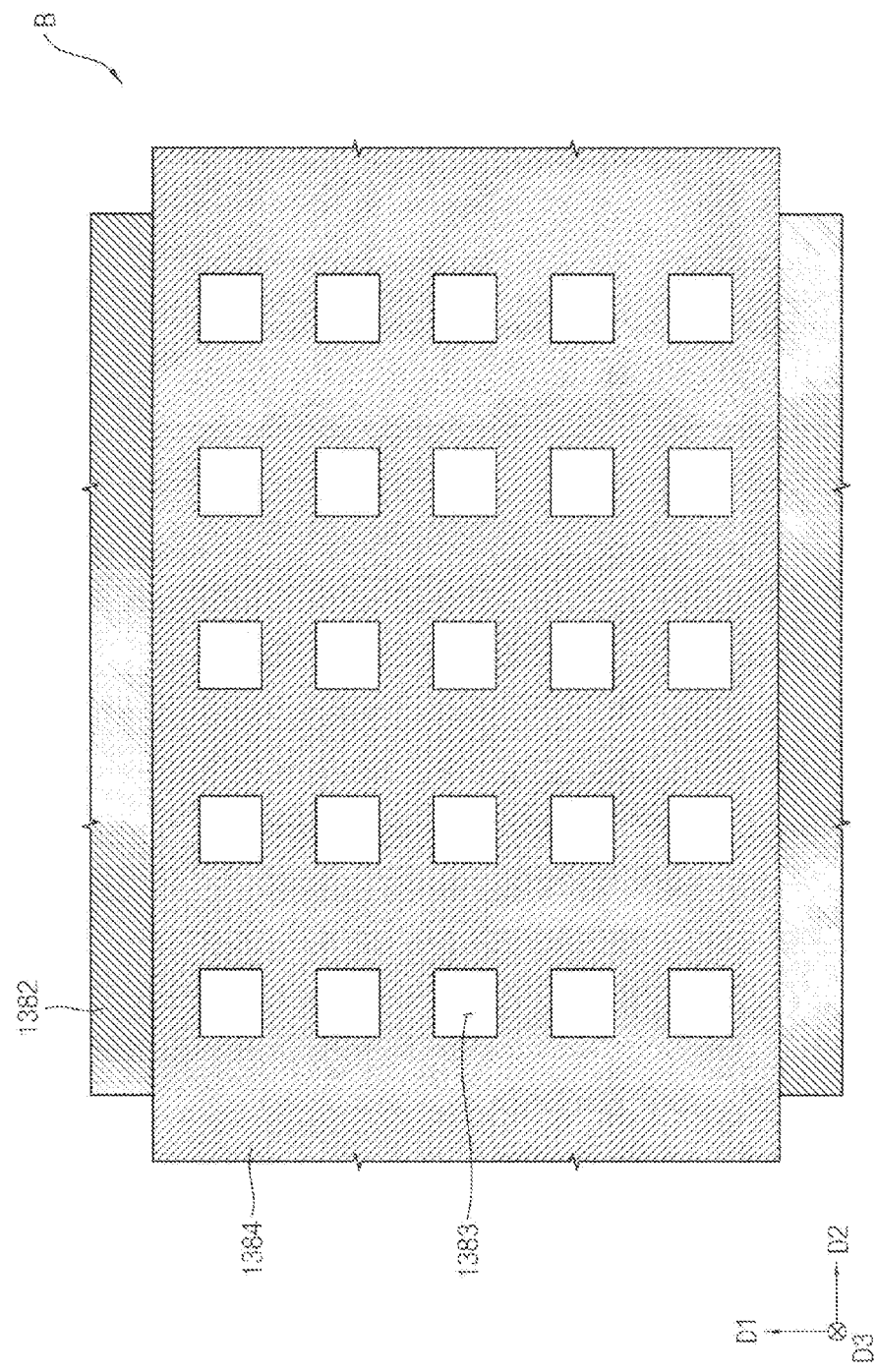
FIG. 14 is an enlarged planar view corresponding to region 'B' of FIG. 13.

FIG. 12 is a cross-sectional view illustrating an OLED device in accordance with example embodiments, and FIG. 13 is a planar view describing a reflection structure included in the OLED device of FIG. 12. FIG. 14 is an enlarged planar view corresponding to region B' of FIG. 13. An OLED device 1000 illustrated in FIGS. 12, 13, and 14 may have a configuration substantially the same as or similar to that of the OLED device 100 described with reference to FIGS. 1, 2, 3, and 4 except a reflection structure 1380. In FIGS. 12, 13, and 14, detailed descriptions for elements that are substantially the same as or similar to elements described with reference to FIGS. 1, 2, 3, and 4 may not be repeated. FIG. 12 may correspond to a cross-sectional view taken along line II-IF of FIG. 13.

Referring to FIGS. 1, 2, 3, and 4, an OLED device 1000 may include a substrate 110, a reflection structure 1380, a buffer layer 115, a semiconductor element 250, a planarization layer 270, a sub-pixel structure 300, a pixel defining layer 310, and a TFE structure 450. Here, the semiconductor element 250 may include an active layer 130, a gate insulation layer 150, a gate electrode 170, an insulating interlayer 190, a source electrode 210, and a drain electrode 230. The sub-pixel structure 300 may include a lower electrode 290, a light emitting layer 330, and an upper electrode 340. In addition, the reflection structure 1380 may include a plurality of first reflection patterns 1382 and a plurality of second reflection patterns 1384.

As illustrated in FIGS. 13 and 14, each of the first reflection patterns 1382 may extend in a first direction D1 that is parallel to an upper surface of the substrate 110, and may be spaced apart from each other in a second direction D2 that is substantially perpendicular to the first direction D1. Each of the second reflection patterns 1384 may extend in the second direction D2 on the first reflection patterns 1382, and may be spaced apart from each other in the first direction D1. In addition, touch sensing voltages may be applied to the reflection structure 1380, and the OLED device 1000 may sense a user's touch on the surface of the OLED device 1000 by detecting a change of capacitance.

Each of the first and second reflection patterns 1382 and 1384 may have a planar shape of a bar, and may cross or intersect each other and be regularly arranged. In addition, the first reflection pattern 1382 may be located at different levels with the second reflection pattern 1384 on the substrate 110. For example, the second reflection pattern 1384 may be disposed on the first reflection pattern 1382. As described above, as the OLED device 1000 includes the reflection structure 1380, an image of an object that is located in front of the first surface S1 of the OLED device 1000 may be reflected in the third direction D3.

In example embodiments, as illustrated in FIGS. 13 and 14, each of the first reflection patterns 1382 and the second reflection patterns 1384 may have a mesh structure including a plurality of openings 1383. The sub-pixel region 10 may correspond to each of the openings 1383, and the sub-pixel structures 300 may be disposed in a region corresponding to each of the openings 1383. That is, a first group of sub-pixel regions 10 may be located in the openings 1383 included in the first reflection pattern 1382, and a second group of sub-pixel regions 10 may be located in the openings 1383 included in the second reflection pattern 1384. As described above, as the OLED device 1000 includes the openings 1383 of the reflection structure 1380, a light emitted from the sub-pixel structure 300 may be emitted via the openings 1383 in the third direction D3. In example embodiments, as illustrated in FIG. 14, the openings 1383 located in a portion crossing the first reflection pattern 1382 and the second reflection pattern 1384 may be overlapped to each other such that the sub-pixel region 10 is exposed. Alternatively, a size of each of the openings 1383 located in a portion crossing the first reflection pattern 1382 and the second reflection pattern 1384 may be different from each other.

In example embodiments, the OLED device 1000 may electrically connect the first and second reflection patterns 1382 and 1384 and an external device (e.g., external device 105 of FIG. 4) through a touch sensor wiring (not shown), and may provide first and second touch sensing voltages generated from the external device to the first and second reflection patterns 1382 and 1384, respectively. The external device may detect a change of capacitance between the first reflection pattern 1382 and the second reflection pattern 1384. The external device may provide the first touch sensing voltage that is a sensing input signal to the first reflection pattern 1382 and receive the second touch sensing voltage that is a sensing output signal through the second reflection pattern 1384. Here, the first touch sensing voltage may have a voltage level that is periodically changed, and the second touch sensing voltage may have a direct current voltage level. For example, when the user of the OLED device 1000 contacts the first surface S1, a capacitance between the first reflection pattern 1382 and the second reflection pattern 1384 that are corresponding to the contact surface may be changed. In other word, a change of capacitance may be generated between a portion of the body that is contacted to the first surface S1 and the first and second reflection patterns 1382 and 1384, and the external device may receive the sensing output signal that is changed by the changed capacitance, through the touch sensor wiring. Thus, the external device may detect the changed sensing output signal. That is, the external device and the OLED device 1000 may sense a contact position of the user's touch using the first and second touch sensing voltages. After a contact of the user and the OLED device 1000 is ended (e.g., the user and the OLED device 1000 are electrically separated), the external device may provide the first and second touch sensing voltages to the first and second reflection patterns 1382 and 1384, respectively. Each of the first reflection pattern 1382 and the second reflection pattern 1384 may include one or more of a metal, a metal alloy, metal nitride, conductive metal oxide, and a transparent conductive material. For example, each of the first reflection patterns 1382 and the second reflection patterns 1384 may be formed of Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, CrNx, an alloy of molybdenum, TiNx, TaNx, or SRO. These may be used alone or in a suitable combination thereof. Alternatively, each of the first reflection pattern 1382 and the second reflection pattern 1384 may have a multi-layered structure.

Accordingly, although the first and second reflection patterns 1382 and 1384 having a large thickness are disposed, the OLED device 1000 may display the displaying image in the third direction D3 via the openings 1383. The thicknesses of the first and second reflection patterns 382 and 384 are determined to be thick enough to reflect light such that the OLED device 1000 may reflect an image of an object that is located in front of the first surface S1 of the OLED device 1000 in the third direction D3. In addition, the OLED device 1000 may detect a contact position of the user through the reflection structure 1380 and the external device.

Figure 15:
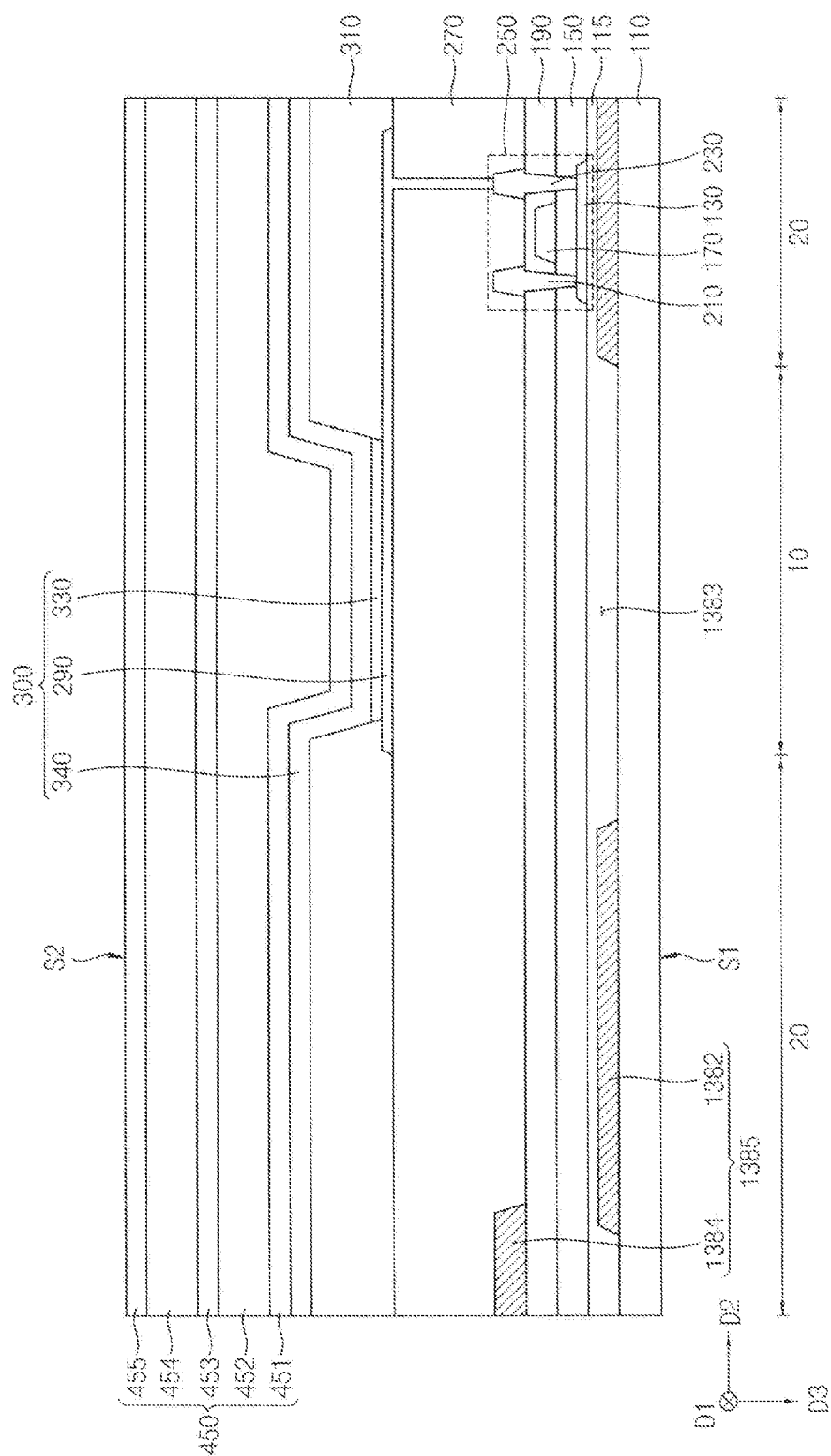
FIG. 15 is a cross-sectional view illustrating an OLED device in accordance with example embodiments.

FIG. 15 is a cross-sectional view illustrating an OLED device in accordance with example embodiments. An OLED device illustrated in FIG. 15 may have a configuration substantially the same as or similar to that of the OLED device 1000 described with reference to FIGS. 12, 13, and 14 except a reflection structure 1385. In FIG. 15, detailed descriptions for elements that are substantially the same as or similar to elements described with reference to FIGS. 12, 13, and 14 may not be repeated.

Referring to FIGS. 12, 13, 14, and 15, the reflection structure 1385 may include a first reflection pattern 1382 and a second reflection pattern 1384. The first reflection pattern 1382 may be disposed on the substrate 110, and the second reflection pattern 1384 may be disposed on the insulating interlayer 190. For example, after a preliminary electrode is formed on the insulating interlayer 190, the source electrode 210, and the drain electrode 230, and the second reflection pattern 1384 may be formed by partially removing the preliminary electrode. That is, the source electrode 210, the drain electrode 230, and the second reflection pattern 1384 may be simultaneously formed using the same material.

Figure 16:
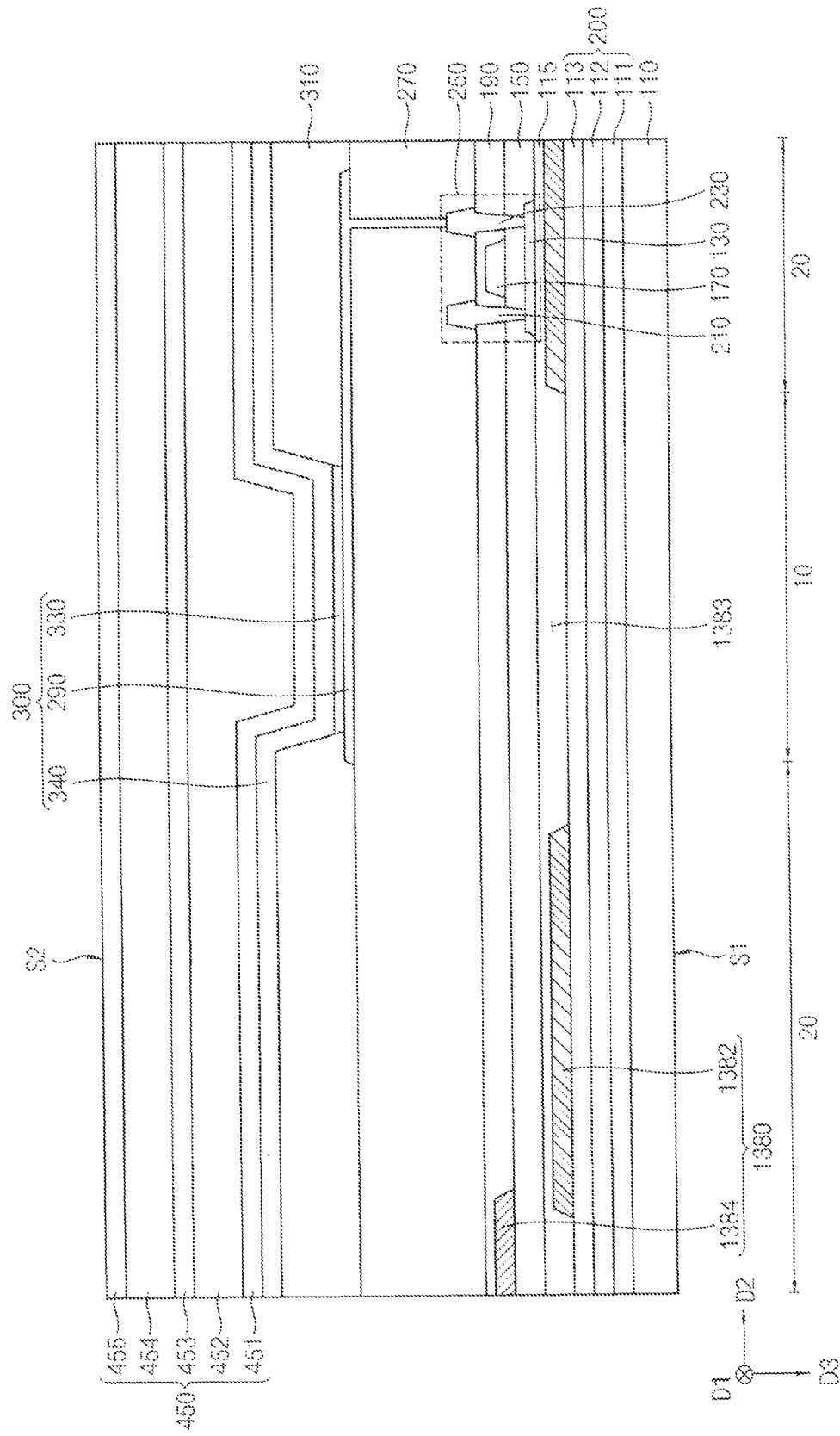
FIG. 16 is a cross-sectional view illustrating an OLED device in accordance with example embodiments.

FIG. 16 is a cross-sectional view illustrating an OLED device in accordance with example embodiments. An OLED device illustrated in FIG. 16 may have a configuration substantially the same as or similar to that of the OLED device 1000 described with reference to FIGS. 12, 13, and 14 except a dielectric mirror structure 200. In FIG. 16, detailed descriptions for elements that are substantially the same as or similar to elements described with reference to FIGS. 12, 13, and 14 may not be repeated.

Referring to FIGS. 12, 13, 14, and 16, an OLED device may include a substrate 110, a dielectric mirror structure 200, a reflection structure 1380, a buffer layer 115, a semiconductor element 250, a planarization layer 270, a sub-pixel structure 300, a pixel defining layer 310, and a TFE structure 450. Here, the semiconductor element 250 may include an active layer 130, a gate insulation layer 150, a gate electrode 170, an insulating interlayer 190, a source electrode 210, and a drain electrode 230. The sub-pixel structure 300 may include a lower electrode 290, a light emitting layer 330, and an upper electrode 340. In addition, the reflection structure 1380 may include a plurality of first reflection patterns 1382 and a plurality of second reflection patterns 1384. Further, the dielectric mirror structure 200 may include a first dielectric layer 111, a second dielectric layer 112, and a third dielectric layer 113.

The first dielectric layer 111 may be disposed on the substrate 110 covering the entire substrate 110. In example embodiments, the first dielectric layer 111 may have a first refractive index. For example, the first dielectric layer 111 may have the first refractive index by controlling a weight ratio of materials included in the first dielectric layer 111, or by controlling a thickness of the first dielectric layer 111. The first dielectric layer 111 may include one or more of a silicon compound and metal oxide.

The second dielectric layer 112 may be disposed on the first dielectric layer 111 covering the entire first dielectric layer 111. In example embodiments, the second dielectric layer 112 may have a second refractive index that is different from the first refractive index. The second dielectric layer 112 may have the second refractive index by controlling a weight ratio of materials included in the second dielectric layer 112, or by controlling a thickness of the second dielectric layer 112. For example, the first refractive index may be a high refractive index, and the second refractive index may be a low refractive index. The second dielectric layer 112 may include one or more of a silicon compound and metal oxide.

The third dielectric layer 113 may be disposed on the second dielectric layer 112 covering the entire second dielectric layer 112. In example embodiments, the third dielectric layer 113 may have the first refractive index. For example, the third dielectric layer 113 and the first dielectric layer 111 may be substantially the same. The third dielectric layer 113 may include one or more of a silicon compound and metal oxide. Alternatively, an additional dielectric layer may be disposed on the third dielectric layer 113. For example, the additional dielectric layer and the second dielectric layer 112 may have the same refractive index.

Figure 17:
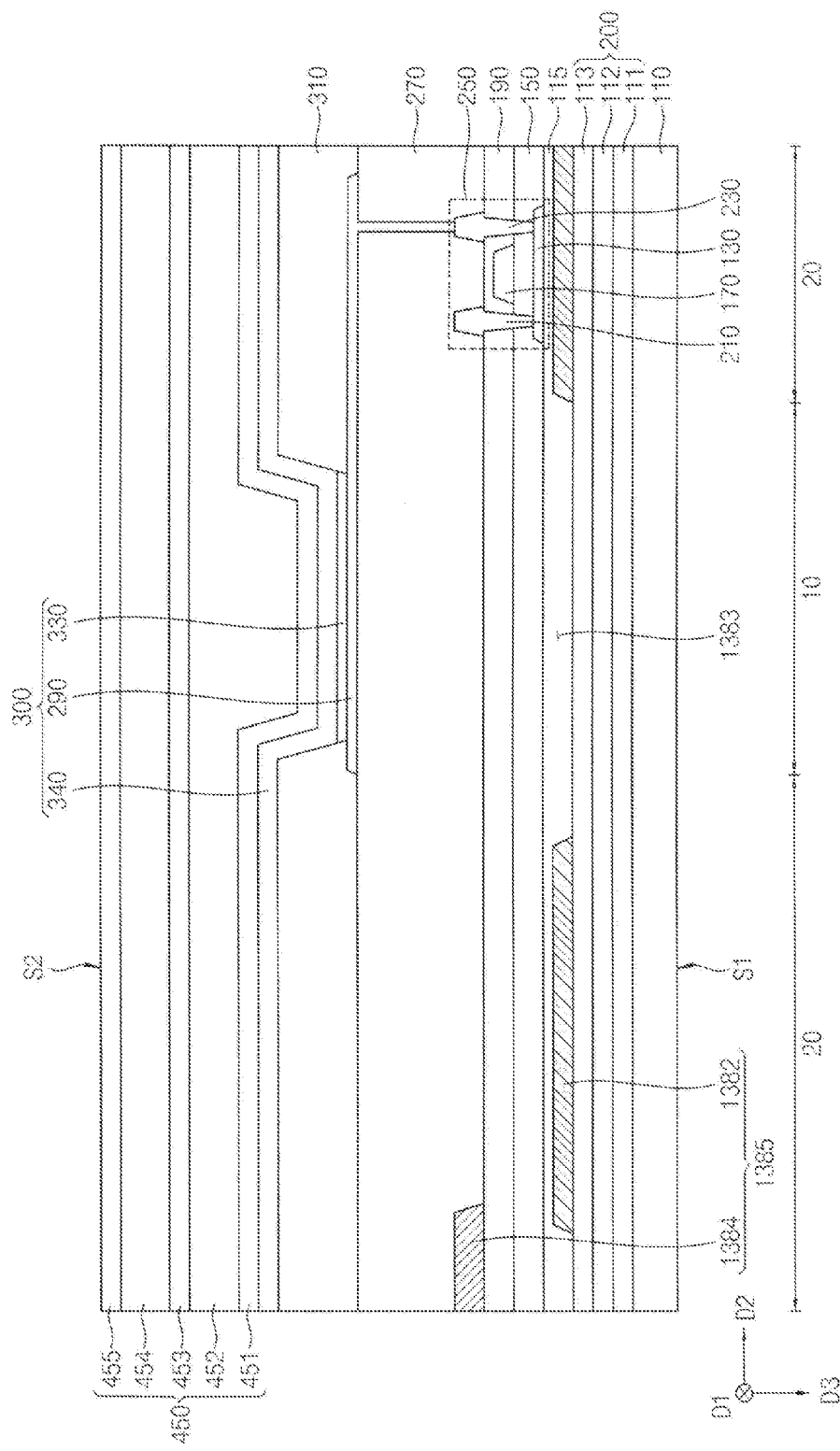
FIG. 17 is a cross-sectional view illustrating an OLED device in accordance with example embodiments.

FIG. 17 is a cross-sectional view illustrating an OLED device in accordance with example embodiments. An OLED device illustrated in FIG. 17 may have a configuration substantially the same as or similar to that of the OLED device 1000 described with reference to FIGS. 12, 13, and 14 except a reflection structure 1385 and a dielectric mirror structure 200. In FIG. 17, detailed descriptions for elements that are substantially the same as or similar to elements described with reference to FIGS. 12, 13, and 14 may not be repeated.

Referring to FIGS. 12, 13, 14, and 17, an OLED device may include a substrate 110, a dielectric mirror structure 200, a reflection structure 1385, a buffer layer 115, a semiconductor element 250, a planarization layer 270, a sub-pixel structure 300, a pixel defining layer 310, and a TFE structure 450. Here, the semiconductor element 250 may include an active layer 130, a gate insulation layer 150, a gate electrode 170, an insulating interlayer 190, a source electrode 210, and a drain electrode 230. The sub-pixel structure 300 may include a lower electrode 290, a light emitting layer 330, and an upper electrode 340. In addition, the reflection structure 1385 may include a plurality of first reflection patterns 1382 and a plurality of second reflection patterns 1384. Further, the dielectric mirror structure 200 may include a first dielectric layer 111, a second dielectric layer 112, and a third dielectric layer 113.

The first dielectric layer 111 may be disposed on the substrate 110. In example embodiments, the first dielectric layer 111 may have a first refractive index. The first dielectric layer 111 may include one or more of a silicon compound and metal oxide.

The second dielectric layer 112 may be disposed on the first dielectric layer 111. In example embodiments, the second dielectric layer 112 may have a second refractive index that is different from the first refractive index. For example, the first refractive index may be a high refractive index, and the second refractive index may be a low refractive index. The second dielectric layer 112 may include one or more of a silicon compound and metal oxide.

The third dielectric layer 113 may be disposed on the second dielectric layer 112. In example embodiments, the third dielectric layer 113 may have the first refractive index. For example, the third dielectric layer 113 and the first dielectric layer 111 may be substantially the same.

The reflection structure 1385 may include a first reflection pattern 1382 and a second reflection pattern 1384. The first reflection pattern 1382 may be disposed on the substrate 110, and the second reflection pattern 1384 may be disposed on the insulating interlayer 190. For example, after a preliminary electrode is formed on the insulating interlayer 190, the source electrode 210, and the drain electrode 230, and the second reflection pattern 1384 may be formed by partially removing the preliminary electrode. That is, the source electrode 210, the drain electrode 230, and the second reflection pattern 1384 may be simultaneously formed using the same material.

Figure 18:
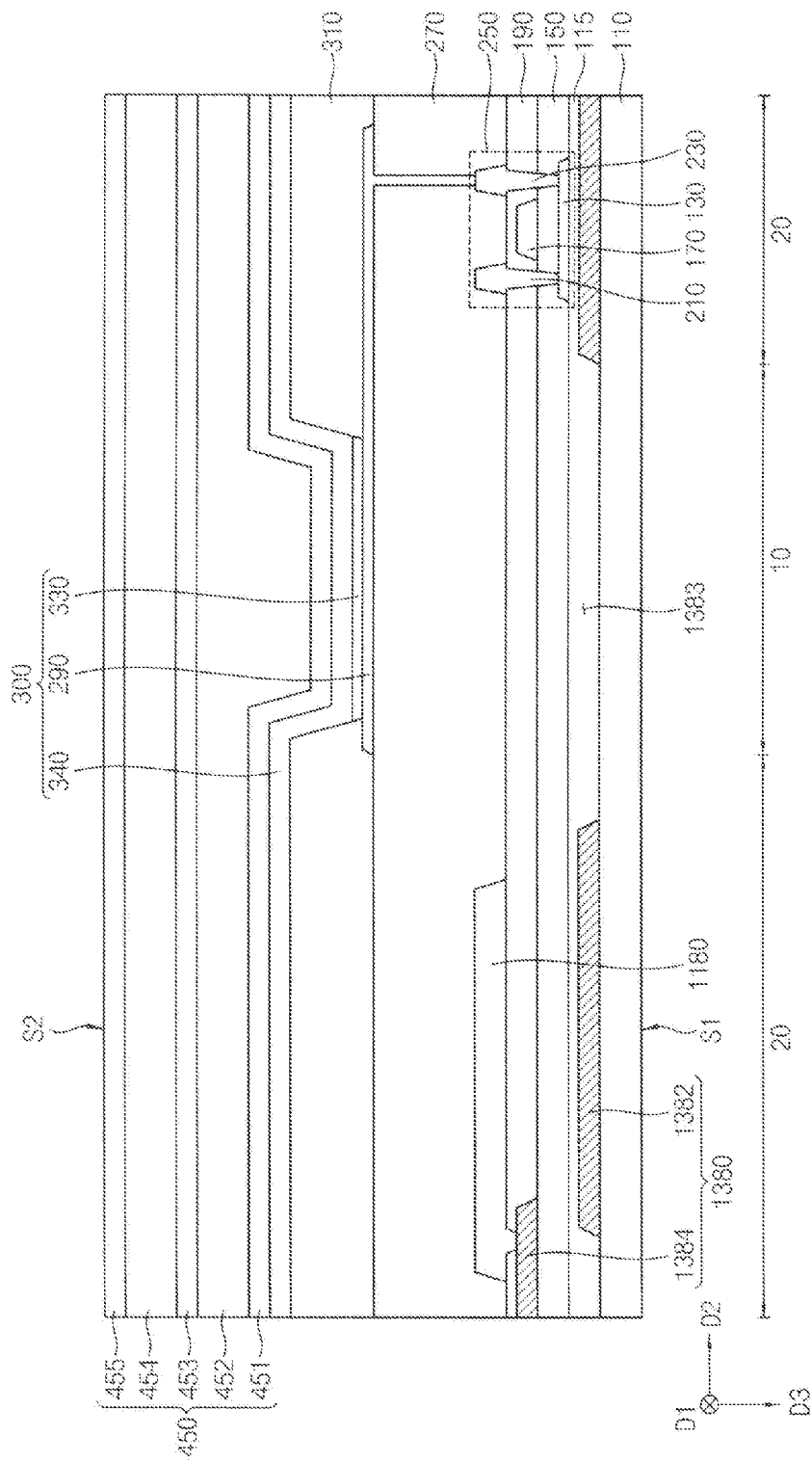
FIG. 18 is a cross-sectional view illustrating an OLED device in accordance with example embodiments.
Figure 19:
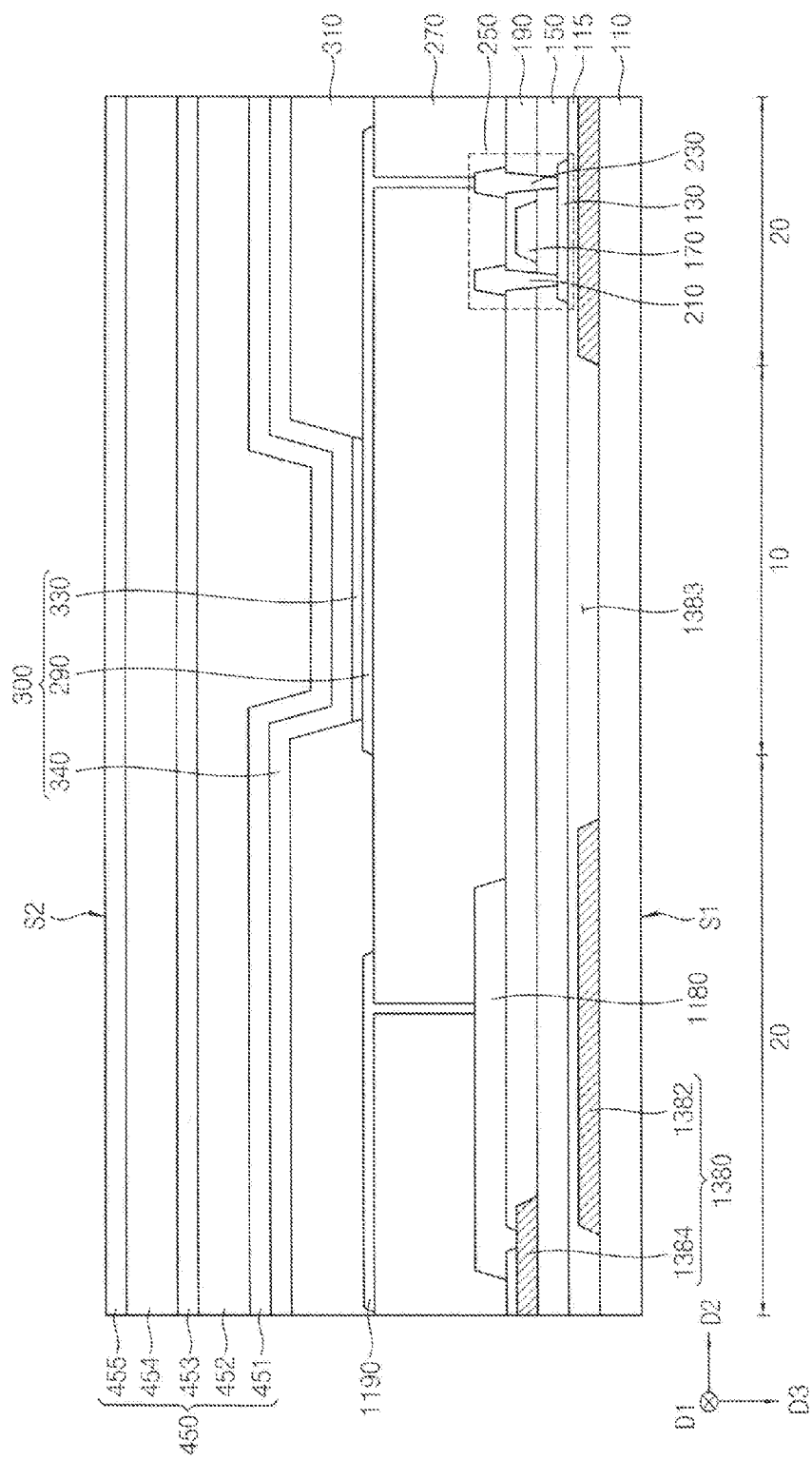
FIG. 19 is a cross-sectional view illustrating an OLED device in accordance with example embodiments.

FIG. 18 is a cross-sectional view illustrating an OLED device in accordance with example embodiments, and FIG. 19 is a cross-sectional view illustrating an OLED device in accordance with example embodiments. OLED devices illustrated in FIGS. 18 and 19 may have a configuration substantially the same as or similar to that of the OLED device 1000 described with reference to FIGS. 12, 13, and 14 except a first auxiliary wiring 1180 and a second auxiliary wiring 1190. In FIGS. 18 and 19, detailed descriptions for elements that are substantially the same as or similar to elements described with reference to FIGS. 12, 13, and 14 may not be repeated.

Referring to FIGS. 12, 13, 14, and 18, an OLED device may include a substrate 110, a reflection structure 1380, a buffer layer 115, a semiconductor element 250, a first auxiliary wiring 1180, a planarization layer 270, a sub-pixel structure 300, a pixel defining layer 310, and a TFE structure 450. Here, the semiconductor element 250 may include an active layer 130, a gate insulation layer 150, a gate electrode 170, an insulating interlayer 190, a source electrode 210, and a drain electrode 230. The sub-pixel structure 300 may include a lower electrode 290, a light emitting layer 330, and an upper electrode 340. In addition, the reflection structure 1380 may include a plurality of first reflection patterns 1382 and a plurality of second reflection patterns 1384.

The first auxiliary wiring 1180 may be disposed on the insulating interlayer 190 overlapping the reflection structure 1380 in the reflection region 20. The first auxiliary wiring 1180 may be in contact with the second reflection pattern 1384 via a contact hole formed by removing a portion of the insulating interlayer 190. The first auxiliary wiring 1180 may be electrically connected to the second reflection pattern 1384 such that a wiring resistance of the second reflection pattern 1384 is reduced. Alternatively, the reflection structure 1380 may serve as a touch sensing electrode, and an external device may detect a pressure or force sensing and/or sense a pressure or force touch using a capacitor formed between the first reflection pattern 1382 and the first auxiliary wiring 1180.

In some example embodiments, the first auxiliary wiring 1180 may be in contact with the first reflection pattern 1382 via a contact hole formed removing each portion of the insulating interlayer 190, the gate insulation layer 150, and the buffer layer 115, and the first auxiliary wiring 1180 may be electrically connected to the first reflection pattern 1382 such that a wiring resistance of the first reflection pattern 1382 is reduced.

In some example embodiments, as illustrated in FIG. 19, the OLED device may further include a second auxiliary wiring 1190 disposed on the planarization layer 270. The second auxiliary wiring 1190 may be in contact with the first auxiliary wiring 1180 via a contact hole by removing a portion of the insulating interlayer 190. That is, the second auxiliary wiring 1190 may be electrically connected to the first auxiliary wiring 1180 and the second reflection pattern 1384.

Figure 20:
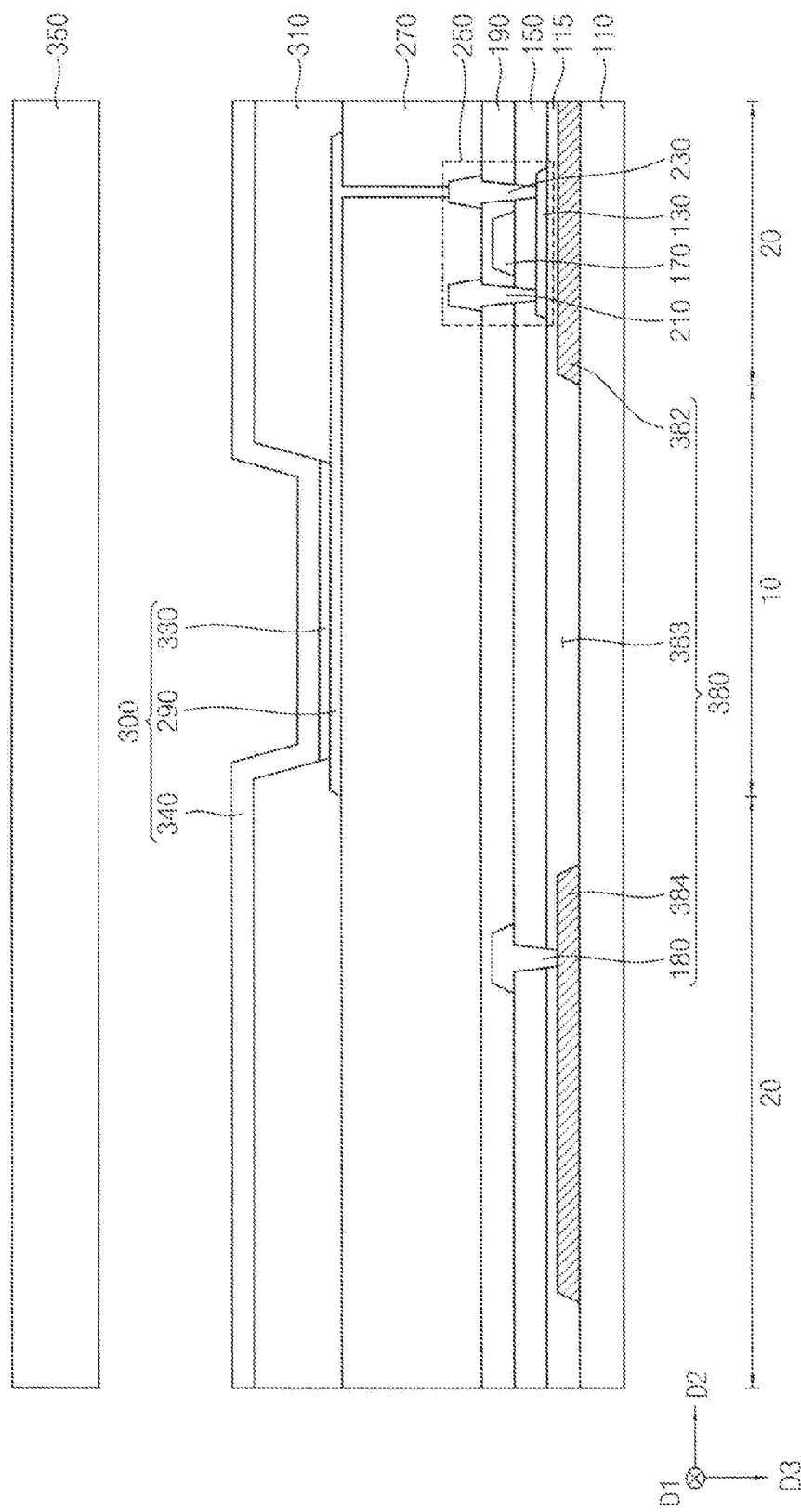
FIG. 20 is a cross-sectional view illustrating an OLED device in accordance with example embodiments.

FIG. 20 is a cross-sectional view illustrating an OLED device in accordance with example embodiments, and FIG. 21 is a cross-sectional view describing a sealant included in the OLED device of FIG. 20. OLED devices illustrated in FIGS. 20 and 21 may have a configuration substantially the same as or similar to that of the OLED device 100 described with reference to FIGS. 1, 2, 3, and 4 except a substrate 110, a sealant 410, and an encapsulation substrate 350. In FIGS. 20 and 21, detailed descriptions for elements that are substantially the same as or similar to elements described with reference to FIGS. 1, 2, 3, and 4 may not be repeated.

Referring to FIGS. 20 and 21, an OLED device may include a substrate 110, a reflection structure 380, a buffer layer 115, a semiconductor element 250, a planarization layer 270, a sub-pixel structure 300, a pixel defining layer 310, a sealant 410, and an encapsulation substrate 350. Here, the semiconductor element 250 may include an active layer 130, a gate insulation layer 150, a gate electrode 170, an insulating interlayer 190, a source electrode 210, and a drain electrode 230. The sub-pixel structure 300 may include a lower electrode 290, a light emitting layer 330, and an upper electrode 340. In addition, the reflection structure 380 may include a plurality of first reflection patterns 382, a plurality of second reflection patterns 384, and a plurality of connection patterns 180.

The substrate 110 may be formed of a transparent material. In example embodiments, the substrate 110 may include a quartz substrate, a synthetic quartz substrate, a calcium fluoride substrate, a fluoride-doped quartz substrate, a soda lime glass substrate, a non-alkali substrate, or the like.

The encapsulation substrate 350 may be disposed on the upper electrode 340. The encapsulation substrate 350 and the substrate 110 may have the same material. For example, the encapsulation substrate 350 may include a quartz substrate, a synthetic quartz substrate, a calcium fluoride substrate, a fluoride-doped quartz substrate, a soda lime glass substrate, a non-alkali substrate, or the like.

As illustrated in FIG. 21, a display panel 400 may be disposed between the substrate 110 and the encapsulation substrate 350. For example, the display panel 400 may include the reflection structure 380, the buffer layer 115, a plurality of semiconductor elements 250, the planarization layer 270, a plurality of sub-pixel structures 300, and the pixel defining layer 310 that are disposed on the substrate 110.

The sealant 410 may be interposed between the substrate 110 and the encapsulation substrate 350, and may be disposed in outer regions of the substrate 110 and the encapsulation substrate 350. The outer regions of the substrate 110 and the encapsulation substrate 350 where the sealant 410 is disposed may generally correspond to the boundary regions of the substrate 110 and the encapsulation substrate 350. In some cases, small edge portions of the substrate 110 and/or the encapsulation substrate 350 may extend out beyond the outer regions of the substrate 110 and/or the encapsulation substrate 350. An encapsulation process may be performed to combine the substrate 110 and the encapsulation substrate 350. In this case, the sealant 410 may be interposed in the outer regions between the substrate 110 and the encapsulation substrate 350.

The sealant may include a frit, or the like. For example, the substrate 110 and the encapsulation substrate 350 may be combined to each other through a laser irradiation process. Here, the laser may be irradiated into the sealant 410. In the laser irradiation process, a phase of the sealant 410 may be changed from a solid phase to a liquid phase. Then, the sealant 410 of the liquid phase may be cured to the solid phase again after a predetermined time. In accordance with the phase change of the sealant 410, the substrate 110 may be combined with the encapsulation substrate 350. The sealed structure of the substrate 110 and the encapsulation substrate 350 may protect the OLED device from permeation of water, moisture, oxygen, etc. The OLED device may not be deteriorated by the water, the moisture, the oxygen, etc.

The present disclosure may be applied to various types and applications of display devices including an organic light emitting diode (OLED) display device. For example, the present disclosure may be applied to a vehicle-display device, a ship-display device, an aircraft-display device, a portable communication device, a display device for display or for information transfer, a medical-display device, etc.

The foregoing is illustrative of example embodiments and is not to be construed as limiting thereof. Although some example embodiments have been described, those skilled in the art will readily appreciate that other variations and/or modifications are possible in the example embodiments without materially departing from the novel teachings and advantages of the present disclosure. Accordingly, all such variations and/or modifications are intended to be included within the scope of the present disclosure. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present disclosure.

What is claimed is:

1. An organic light emitting diode (OLED) display device, comprising:
    a substrate including a plurality of sub-pixel regions and a reflection region surrounding the plurality of sub-pixel regions;
    a reflection structure disposed on the substrate in the reflection region and having a plurality of openings exposing the plurality of sub-pixel regions, wherein the reflection structure includes:
        first reflection patterns extending in a first direction that is parallel to an upper surface of the substrate and being spaced apart from each other in a second direction that is perpendicular to the first direction; second reflection patterns being spaced apart from each other in the first direction between two adjacent first reflection patterns among the first reflection patterns; and
        connection patterns electrically connecting two adjacent second reflection patterns in the second direction among the second reflection patterns; and
    a sub-pixel structure disposed on the substrate in each of the plurality of sub-pixel regions,
    wherein the reflection structure reflects an image of an object that is located in front of a first surface of the OLED device, and
    wherein the OLED device displays a displaying image in the first surface through the plurality of openings.

2. The OLED device of claim 1, wherein the reflection structure is disposed between the substrate and the sub-pixel structure.

3. The OLED device of claim 1, wherein the first reflection patterns are configured to receive a first touch sensing voltage from an external device, and the second reflection patterns are configured to receive a second touch sensing voltage from the external device, and
    wherein the external device detects a change of capacitance between the first reflection patterns and the second reflection patterns.

4. The OLED device of claim 1, wherein each of the first reflection patterns has a planar bar shape and is regularly arranged in the second direction,
    wherein each of the second reflection patterns has an island shape and is regularly arranged in the first direction, and
    wherein the first reflection patterns and the second reflection patterns are spaced apart from each other.

5. The OLED device of claim 1, wherein each of the first and second reflection patterns has a mesh structure including the plurality of openings.

6. The OLED device of claim 1, further comprising:
    a thin film encapsulation structure disposed on the sub-pixel structure,
    wherein each of the substrate and the thin film encapsulation structure has a stack structure where at least one organic layer and at least one inorganic layer are alternately stacked, and the stack structure is flexible, and
    wherein the reflection structure is in contact with the at least one inorganic layer of the substrate, and the sub-pixel structure is in contact with the at least one inorganic layer of the thin film encapsulation structure.

7. The OLED device of claim 1, further comprising:
    an encapsulation substrate disposed on the sub-pixel structure; and
    a sealant interposed between the substrate and the encapsulation substrate, the sealant being disposed in outer regions of the substrate and the encapsulation substrate,
    wherein each of the substrate and the encapsulation substrate includes rigid materials, and the sealant includes a frit, and
    wherein the substrate and the encapsulation substrate are combined by the sealant.

8. The OLED device of claim 1, wherein the sub-pixel structure includes:
    a lower electrode disposed on the substrate, the lower electrode transmitting a light;
    a light emitting layer disposed on the lower electrode; and
    an upper electrode disposed on the light emitting layer, the upper electrode reflecting a light that is emitted from the light emitting layer, wherein a reflectivity of the upper electrode is greater than a reflectivity of the lower electrode, and the upper electrode is disposed on the substrate in the sub-pixel region and the reflection region.

9. The OLED device of claim 8, wherein the upper electrode reflects an image of an object that is located in front of a second surface of the OLED device, wherein the second surface is opposite to the first surface.

10. The OLED device of claim 1, further comprising:
a semiconductor element disposed on the substrate in the reflection region; and
a buffer layer disposed on the substrate between the reflection structure and the semiconductor element, wherein the semiconductor element includes:
an active layer disposed on the buffer layer in the reflection region;
a gate electrode disposed on the active layer; and
source and drain electrodes disposed on the gate electrode.

11. The OLED device of claim 10, wherein the connection patterns and the gate electrode are simultaneously formed using the same material.

12. The OLED device of claim 1, further comprising:
a dielectric mirror structure disposed between the substrate and the reflection structure.

13. The OLED device of claim 12, wherein the dielectric mirror structure includes:
one or more first dielectric layers having a first refractive index; and
one or more second dielectric layers disposed on the one or more first dielectric layers, the one or more second dielectric layers having a second refractive index that is different from the first refractive index, and
wherein the one or more first dielectric layers and the more second dielectric layers are alternately stacked.

14. An organic light emitting diode (OLED) display device, comprising:
a substrate including a plurality of sub-pixel regions and a reflection region surrounding the plurality of sub-pixel regions;
a reflection structure disposed on the substrate in the reflection region and having a plurality of openings exposing the plurality of sub-pixel regions, wherein the reflection structure includes:
first reflection patterns extending in a first direction that is parallel to an upper surface of the substrate and being spaced apart from each other in a second direction that is perpendicular to the first direction;
second reflection patterns being spaced apart from each other in the first direction between two adjacent first reflection patterns among the first reflection patterns; and
connection patterns electrically connecting two adjacent second reflection patterns in the second direction among the second reflection patterns; and
a sub-pixel structure disposed on the substrate in each of the plurality of sub-pixel regions,
wherein at least one groove is formed in a border of the first reflection pattern and the second reflection pattern.

15. An OLED display device, comprising:
a substrate including a plurality of sub-pixel regions and a reflection region surrounding the plurality of sub-pixel regions;
a sub-pixel structure disposed on the substrate in each of the plurality of sub-pixel regions; and a reflection structure disposed on the substrate in the reflection region and having a plurality of openings, the plurality of sub-pixel regions being exposed through the plurality of openings,
wherein the reflection structure includes first reflection patterns arranged in a first direction and
second reflection patterns arranged in the second direction that is perpendicular to the first direction,
wherein the reflection structure reflects an image of an object that is located in front of a first surface of the OLED device, and
wherein the OLED device displays a displaying image in the first surface through the plurality of openings.

16. The OLED device of claim 15, wherein the reflection structure is disposed between the substrate and the sub-pixel structure.

17. The OLED device of claim 15, wherein the first reflection patterns are configured to receive a first touch sensing voltage from an external device, and the second reflection patterns are configured to receive a second touch sensing voltage from the external device, and
wherein the external device detects a change of capacitance between the first reflection patterns and the second reflection patterns.

18. The OLED device of claim 15, wherein each of the first and second reflection patterns has a planar bar shape and is regularly arranged to each other, and
wherein each of the first and second reflection patterns has a mesh structure including the plurality of openings.

19. The OLED device of claim 18, wherein the first reflection patterns and the second reflection patterns are crossed in a cross-over region, and wherein a first group of the plurality of openings of the first reflection patterns and a second group of the plurality of openings of the second reflection patterns that are located in the cross-over region are overlapped to each other.

20. The OLED device of claim 15, further comprising:
a thin film encapsulation structure disposed on the sub-pixel structure,
wherein each of the substrate and the thin film encapsulation structure has a stack structure where at least one organic layer and at least one inorganic layer are alternately stacked, and the stack structure is flexible, and
wherein the reflection structure is in contact with the at least one inorganic layer of the substrate, and the sub-pixel structure is in contact with the at least one inorganic layer of the thin film encapsulation structure.

21. The OLED device of claim 15, further comprising:
a semiconductor element disposed on the substrate in the reflection region; and
a buffer layer disposed on the substrate between the first reflection pattern and the semiconductor element, wherein the semiconductor element includes:
an active layer disposed on the buffer layer in the reflection region;
a gate electrode disposed on the active layer; and
source and drain electrodes disposed on the gate electrode, and
wherein the second reflection patterns and the gate electrode are simultaneously formed using the same material.

22. The OLED device of claim 21, further comprising:
an auxiliary wiring disposed on the second reflection pattern, the auxiliary wiring being electrically connected to the second reflection patterns, wherein the auxiliary wiring and the source and drain electrodes are simultaneously formed using the same materials.

23. The OLED device of claim 15, further comprising:
a dielectric mirror structure disposed between the substrate and the reflection structure,
wherein the dielectric mirror structure includes:
one or more first dielectric layers having a first refractive index; and
one or more second dielectric layers disposed on the one or more first dielectric layers, the one or more second dielectric layers having a second refractive index that is different from the first refractive index, and
wherein the one or more first dielectric layers and the one or more second dielectric layers are alternately stacked.

24. An OLED device, comprising:
a substrate including a plurality of sub-pixel regions and a reflection region surrounding the plurality of sub-pixel regions;
a sub-pixel structure disposed on the substrate in each of the plurality of sub-pixel regions; and
a sensing structure disposed on the substrate in the reflection region and having a plurality of openings, the plurality of sub-pixel regions being exposed through the plurality of openings,
wherein the sensing structure includes first sensing patterns and second sensing patterns insulated from the first sensing patterns,
wherein the sensing structure is disposed between the substrate and the sub-pixel structure,
wherein the sensing structure reflects an image of an object that is located in front of a first surface of the OLED device, and
wherein the OLED device displays a displaying image in the first surface through the plurality of openings.

25. The OLED device of claim 24, wherein the sensing structure further comprising connection patterns electrically connecting two adjacent second sensing patterns in a second direction among the second sensing patterns, wherein the first sensing patterns extend in a first direction that is perpendicular to the second direction and are spaced apart from each other in the second direction, and wherein the second sensing patterns are spaced apart from each other in the first direction and the second direction.

26. The OLED device of claim 24, wherein the first sensing patterns are arranged in a first direction, and the second sensing patterns are arranged in a second direction that is perpendicular to the first direction.

27. The OLED device of claim 24, wherein each of the first sensing patterns and the second sensing patterns reflect light entering through the substrate.

28. The OLED device of claim 24, wherein the first sensing patterns are applied with a first voltage and the second sensing patterns are applied with a second voltage, and wherein a change of capacitance between the first sensing patterns and the second sensing patterns is detected to determine a position of touch.

29. The OLED device of claim 28, wherein the first voltage is a sensing input signal and the second voltage is a sensing output signal.

30. The OLED device of claim 28, wherein the change of capacitance between the first sensing patterns and the second sensing patterns measures a pressure of touch.

31. The OLED device of claim 28, further comprising a circuit that is configured to generate the first voltage and the second voltage.

* * * * *